(12) United States Patent
Kim et al.

(10) Patent No.: US 12,086,348 B2
(45) Date of Patent: *Sep. 10, 2024

(54) DISPLAY APPARATUS

(71) Applicant: SAMSUNG DISPLAY CO., LTD., Yongin-si (KR)

(72) Inventors: Ki Seo Kim, Yongin-si (KR); Jae-Kyoung Kim, Hwaseong-si (KR); Won Sang Park, Yongin-si (KR); Bong Hyun You, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/459,882

(22) Filed: Sep. 1, 2023

(65) Prior Publication Data

US 2023/0409138 A1    Dec. 21, 2023

Related U.S. Application Data

(63) Continuation of application No. 17/646,743, filed on Jan. 3, 2022, now Pat. No. 11,747,935, which is a (Continued)

(30) Foreign Application Priority Data

Oct. 8, 2019    (KR) .................. 10-2019-0124607

(51) Int. Cl.
   *G06F 3/041*    (2006.01)
   *G06F 3/044*    (2006.01)

(52) U.S. Cl.
   CPC .......... *G06F 3/0416* (2013.01); *G06F 3/0443* (2019.05); *G06F 3/0446* (2019.05); *G06F 2203/04107* (2013.01)

(58) Field of Classification Search
   CPC .... G06F 3/0416; G06F 3/0446; G06F 3/0443; G06F 2203/04107; G06F 1/1658;
   (Continued)

(56) References Cited

U.S. PATENT DOCUMENTS 7,307,625 B2    12/2007  Kurashima et al.
9,571,632 B2    2/2017   Gorilovsky
(Continued)

FOREIGN PATENT DOCUMENTS

CN    104076995 A    10/2014
EP    2416443        2/2012
(Continued)

OTHER PUBLICATIONS

Office Action dated Oct. 12, 2023 in corresponding European Patent Application No. 20196523.3 (8) pages.
(Continued)

*Primary Examiner* — Amy Onyekaba
(74) *Attorney, Agent, or Firm* — F. CHAU & ASSOCIATES, LLC

(57) ABSTRACT

A display apparatus includes a display panel configured to display an image and a touch antenna array disposed on the display panel. The touch antenna array may include a touch electrode, a touch wiring electrically connected to the touch electrode, an antenna electrode including a plurality of antenna elements, a feeder electrically connected to the antenna electrode, and a shielding electrode disposed between the touch wiring and the feeder.

20 Claims, 13 Drawing Sheets

Related U.S. Application Data continuation of application No. 16/938,217, filed on Jul. 24, 2020, now Pat. No. 11,216,108.

(58) Field of Classification Search
CPC .... G06F 1/1698; G06F 1/1626; G06F 1/1643; G06F 1/1652; G06F 3/04162; H04B 5/00; H01L 27/323
See application file for complete search history.

(56) References Cited

U.S. PATENT DOCUMENTS

| | | | |
|---|---|---|---|
| 9,977,545 B2 | 5/2018 | Koito et al. | |
| 10,186,754 B2* | 1/2019 | Yang | G06F 3/041 |
| 10,209,826 B2 | 2/2019 | Ono et al. | |
| 10,489,003 B1* | 11/2019 | Hsu | G06F 3/044 |
| 10,732,764 B1* | 8/2020 | Shanmugam | H01Q 1/44 |
| 11,216,108 B2 | 1/2022 | Kim et al. | |
| 2002/0030628 A1* | 3/2002 | Tsai | H01Q 9/0407 |
| | | | 343/702 |
| 2003/0184480 A1* | 10/2003 | Shibata | H01Q 9/045 |
| | | | 343/700 MS |
| 2004/0001058 A1* | 1/2004 | Nishimura | G09G 3/20 |
| | | | 345/214 |
| 2005/0280597 A1* | 12/2005 | Lee | H04B 1/0458 |
| | | | 343/853 |
| 2007/0132559 A1* | 6/2007 | Schleeh | B60R 21/01532 |
| | | | 340/425.5 |
| 2007/0236393 A1* | 10/2007 | Anzai | H01L 23/481 |
| | | | 257/E21.597 |
| 2008/0303632 A1* | 12/2008 | Hammad | G06K 19/07327 |
| | | | 250/515.1 |
| 2008/0311849 A1* | 12/2008 | Washiro | H01P 1/203 |
| | | | 455/41.1 |
| 2010/0052700 A1* | 3/2010 | Yano | G06F 3/0446 |
| | | | 324/658 |
| 2010/0220071 A1* | 9/2010 | Nishihara | G06F 3/0443 |
| | | | 345/173 |
| 2011/0156966 A1* | 6/2011 | Taniguchi | H01Q 1/2266 |
| | | | 343/702 |
| 2011/0169770 A1* | 7/2011 | Mishina | G06F 3/0446 |
| | | | 345/174 |
| 2011/0248940 A1* | 10/2011 | Chuang | G06F 3/046 |
| | | | 345/173 |
| 2012/0034888 A1* | 2/2012 | De Flaviis | G06F 3/04162 |
| | | | 345/174 |
| 2012/0162128 A1* | 6/2012 | Hyoung | G06F 3/0443 |
| | | | 345/173 |
| 2012/0223919 A1* | 9/2012 | Lin | G06F 3/0442 |
| | | | 345/179 |
| 2013/0162594 A1* | 6/2013 | Paulsen | H01Q 1/22 |
| | | | 345/173 |
| 2013/0328741 A1* | 12/2013 | Degner | G06F 1/1616 |
| | | | 361/679.52 |
| 2013/0328785 A1* | 12/2013 | Brooks | G06F 1/169 |
| | | | 345/170 |
| 2014/0043261 A1* | 2/2014 | Wang | H01Q 1/243 |
| | | | 345/173 |
| 2014/0087658 A1* | 3/2014 | Hou | H04B 5/48 |
| | | | 455/566 |
| 2014/0096616 A1* | 4/2014 | Jeon | G01L 1/005 |
| | | | 438/34 |
| 2014/0111474 A1* | 4/2014 | Bytheway | G06F 3/04164 |
| | | | 345/174 |
| 2014/0225140 A1* | 8/2014 | Nishido | H10K 50/805 |
| | | | 257/98 |
| 2014/0253830 A1* | 9/2014 | Li | G06F 3/0443 |
| | | | 349/12 |
| 2014/0320352 A1* | 10/2014 | Hsu | H01Q 11/10 |
| | | | 343/702 |
| 2014/0332769 A1* | 11/2014 | Lee | H10K 59/126 |
| | | | 257/40 |
| 2014/0375910 A1* | 12/2014 | Tada | G06F 3/0446 |
| | | | 349/12 |
| 2015/0049263 A1* | 2/2015 | Chu | G06F 3/041 |
| | | | 349/12 |
| 2015/0084899 A1* | 3/2015 | Park | G06F 3/041 |
| | | | 345/173 |
| 2015/0091856 A1* | 4/2015 | Park | G06F 3/0446 |
| | | | 345/174 |
| 2015/0123940 A1* | 5/2015 | Park | G06F 3/0441 |
| | | | 345/174 |
| 2015/0185928 A1* | 7/2015 | Son | G06F 3/0445 |
| | | | 345/174 |
| 2015/0193080 A1* | 7/2015 | Takahashi | H01Q 1/44 |
| | | | 345/174 |
| 2015/0242029 A1* | 8/2015 | Kim | G06F 3/046 |
| | | | 345/173 |
| 2015/0255023 A1* | 9/2015 | Lee | H05K 1/028 |
| | | | 345/204 |
| 2015/0363067 A1* | 12/2015 | Winebrand | G06F 3/0442 |
| | | | 345/173 |
| 2016/0026302 A1* | 1/2016 | Li | G06F 3/0446 |
| | | | 345/82 |
| 2016/0209944 A1* | 7/2016 | Shim | G06F 3/04166 |
| 2017/0090614 A1* | 3/2017 | Kuboyama | G06F 1/1643 |
| 2017/0090652 A1* | 3/2017 | Sato | G06F 3/044 |
| 2017/0131808 A1* | 5/2017 | Yeh | H01Q 1/44 |
| 2017/0139520 A1 | 5/2017 | Yeh et al. | |
| 2017/0249032 A1 | 8/2017 | Konopka | |
| 2017/0285844 A1* | 10/2017 | Park | G06F 1/1647 |
| 2017/0371452 A1* | 12/2017 | Endo | H01Q 1/526 |
| 2018/0026223 A1* | 1/2018 | Choi | B32B 27/365 |
| | | | 428/76 |
| 2018/0034130 A1* | 2/2018 | Jang | H01Q 9/0407 |
| 2018/0074623 A1* | 3/2018 | Xi | G06F 3/046 |
| 2019/0036208 A1* | 1/2019 | Yamagishi | G06K 19/0723 |
| 2019/0220123 A1* | 7/2019 | Kanaya | H10K 59/40 |
| 2019/0235647 A1* | 8/2019 | Chang | G06F 3/044 |
| 2019/0250734 A1* | 8/2019 | Lee | H01Q 9/30 |
| 2019/0307028 A1* | 10/2019 | Yazaki | H01Q 1/243 |
| 2019/0369832 A1* | 12/2019 | Sakaue | H05K 1/0259 |
| 2019/0372210 A1* | 12/2019 | Mikata | H01L 21/56 |
| 2020/0033968 A1* | 1/2020 | Yamagishi | G06F 3/04162 |
| 2020/0067176 A1* | 2/2020 | Kim | H01Q 1/38 |
| 2020/0107478 A1* | 4/2020 | Wen | H01Q 1/2266 |
| 2020/0201470 A1* | 6/2020 | Oh | H01Q 1/44 |
| 2020/0209995 A1* | 7/2020 | So | H01Q 21/065 |
| 2020/0227819 A1* | 7/2020 | Oh | H04M 1/0266 |
| 2020/0241663 A1* | 7/2020 | Kao | H04B 5/72 |
| 2020/0267246 A1* | 8/2020 | Song | H05K 1/148 |
| 2020/0343314 A1* | 10/2020 | Nakamura | H01Q 1/243 |
| 2020/0379607 A1* | 12/2020 | Oh | H01Q 21/065 |
| 2020/0393932 A1* | 12/2020 | Kida | G06F 3/0418 |
| 2021/0005960 A1* | 1/2021 | Kida | H01Q 7/00 |
| 2021/0026512 A1* | 1/2021 | Wu | H01Q 1/24 |
| 2021/0103354 A1 | 4/2021 | Kim et al. | |
| 2022/0129106 A1 | 4/2022 | Kim et al. | |

FOREIGN PATENT DOCUMENTS

| | | |
|---|---|---|
| JP | 2004-234270 A2 | 8/2004 |
| JP | 2013-545334 A2 | 12/2013 |
| JP | 2016-206867 A2 | 12/2016 |
| JP | 2017-097504 A2 | 6/2017 |
| KR | 10-2017-0035756 | 3/2017 |

OTHER PUBLICATIONS

European Search Report dated Feb. 18, 2021 from the European Patent Office for correspondeing European Patent Application No. 20196523.3 (10 pages).

Office Action dated Jun. 25, 2024 in corresponding Japanese Patent Application No. 2020-116297 (8) pages, in Japanese.

* cited by examiner

DISPLAY APPARATUS

CROSS-REFERENCE TO RELATED APPLICATIONS

This application is a continuation of U.S. patent application Ser. No. 17/646,743, filed on Jan. 3, 2022, which is a continuation of U.S. patent application Ser. No. 16/938,217, filed on Jul. 24, 2020, now U.S. Pat. No. 11,216,108, which claims priority under 35 USC § 119 to Korean Patent Application No. 10-2019-0124607 filed on Oct. 8, 2019 in the Korean Intellectual Property Office (KIPO), the entire disclosures of which are incorporated by reference herein.

1. FIELD

This disclosure relates generally to a display apparatus and more particularly to a touch screen display apparatus with an embedded antenna.

2. DISCUSSION OF THE RELATED ART

Contemporary display devices such as smartphones, laptops, tablets, televisions and the like typically include one or more embedded antennas to perform a communication function. Various types and arrangements of embedded antennas have been attempted with the aim of occupying minimal space within the overall device and minimizing interference with the internal electronics of the display device.

A touch screen device is generally configured in a stacked structure with a display panel at a lower layer and a transparent conductive touch grid at an upper layer. In a touch screen, when a user touches a region of the touch grid, the touch causes a change in impedance at that region, typically a capacitance change (but in some cases, a resistance change). The impedance change is indicative of a user input at that region, and is detected by circuitry connected to the touch grid, causing the device to initiate a predetermined response.

SUMMARY

Some example embodiments provide a display apparatus including a touch electrode for a touch input function and an antenna electrode for a communication function.

According to an aspect of example embodiments, a display apparatus may include a display panel configured to display an image and a touch antenna array disposed on the display panel. The touch antenna array may include a touch electrode, a touch wiring electrically connected to the touch electrode, an antenna electrode having a plurality of antenna elements, a feeder electrically connected to the antenna electrode, and a shielding electrode disposed between the touch wiring and the feeder.

In example embodiments, the display apparatus may include a display area in which the image is displayed and a non-display area contacting the display area. In addition, the antenna electrode may be disposed in the display area adjacent to the non-display area.

In example embodiments, the touch antenna array may further include a ground wiring spaced apart from the touch wiring, a ground voltage or a constant voltage being applied to the ground wiring, and the shielding electrode may be electrically connected to the ground wiring.

In example embodiments, the touch wiring, the ground wiring, the feeder, and the shielding electrode may be disposed in the non-display area.

In example embodiments, the antenna electrode may be spaced apart from the touch electrode when viewed in a plan view so as not to overlap the touch electrode.

In example embodiments, the touch electrode and the antenna electrode may be disposed on a same layer.

In example embodiments, the display apparatus may further include a first insulating layer disposed between the touch wiring and the shielding electrode and a second insulating layer disposed between the shielding electrode and the feeder.

In example embodiments, the feeder and the antenna electrode may make contact with each other through a contact hole formed in an insulating layer.

In example embodiments, the touch antenna array may further include a ground wiring spaced apart from the touch wiring, a ground voltage or a constant voltage being applied to the ground wiring, and the shielding electrode may extend from the ground wiring.

In example embodiments, the touch antenna array may further include a ground wiring spaced apart from the touch wiring, a ground voltage or a constant voltage being applied to the ground wiring, and the shielding electrode and the ground wiring may make contact with each other through a contact hole formed in an insulating layer.

In example embodiments, the touch antenna array may further include a ground wiring spaced apart from the touch wiring, a ground voltage or a constant voltage being applied to the ground wiring, and the ground wiring and the touch wiring may be disposed on different layers.

In example embodiments, the antenna electrode may include a repeating pattern shape, and the touch electrode may include a pattern shape identical to the pattern shape of the antenna electrode.

In example embodiments, the pattern shape of the antenna electrode may include a lattice pattern or a mesh pattern.

In example embodiments, the display panel may be an organic light emitting diode display panel. In addition, a first power supply voltage, a second power supply voltage, or an initialization voltage for driving the organic light emitting diode display panel may be applied to the shielding electrode.

In example embodiments, the display apparatus may further include a base film disposed between the touch electrode and the antenna electrode and an adhesive layer adhered to the base film.

In example embodiments, the display panel may include a substrate, a thin film transistor layer disposed on the substrate and including a thin film transistor, a pixel defining layer disposed on the thin film transistor layer and configured to define an opening, and a light emitting structure disposed in the opening of the pixel defining layer. In addition, an emission area may be defined to correspond to the opening of the pixel defining layer. Further, the antenna electrode may have a pattern shape including an opening so as not to overlap the emission area.

In example embodiments, the touch electrode may not overlap the emission area.

In example embodiments, the display apparatus may include a display area in which the image is displayed and a non-display area contacting the display area. In addition, the touch wiring may be disposed in the non-display area, and the antenna electrode and the touch electrode may be disposed in the display area.

In example embodiments, a connection portion between the non-display area and the display area may be folded so that the non-display area is located on a rear side of the display area.

In example embodiments, the display area of the display apparatus may include a main display area and an edge display area connected to the main display area. In addition, the non-display area may contact the edge display area, and the edge display area may have a curved surface bent in a direction perpendicular to the main display area. Further, the antenna electrode may be disposed in the edge display area.

According to an aspect of example embodiments, a display apparatus may include a display panel including a display area in which an image is displayed and a non-display area making contact with one side of the display area, a touch antenna array disposed on the display panel, and a touch antenna driver disposed on the non-display area of the display panel. The touch antenna array may include a touch electrode disposed on the display area and an antenna electrode having a plurality of antenna elements disposed on the display area and formed on a same layer as the touch electrode. In addition, the touch antenna driver may transmit an electrical signal to the touch electrode and the antenna electrode and/or may receive an electrical signal from the touch electrode and the antenna electrode.

According to an aspect of example embodiments, a display apparatus may include a display panel configured to display an image and a touch antenna array disposed on the display panel. Here, the touch antenna array may include a touch electrode, a touch wiring electrically connected to the touch electrode, an antenna electrode including a plurality of antenna elements, a feeder electrically connected to the antenna electrode, and a shielding electrode to which a ground voltage or a constant voltage is applied. In addition, at least two of the touch wiring, the feeder, and the shielding electrode may at least partially overlap each other.

A display apparatus according to example embodiments may include a display panel that displays an image and a touch antenna array disposed on the display panel. The touch antenna array may include a touch electrode and an antenna electrode to perform a touch function and an antenna function. In various embodiments as summarized above, since a shielding electrode to which a ground voltage or a constant voltage is applied is disposed between a touch wiring electrically connected to the touch electrode and a feeder electrically connected to the antenna electrode, a signal distortion problem caused by a coupling capacitance between the touch wiring and the feeder, which are driven at different frequencies and voltages, may be prevented.

BRIEF DESCRIPTION OF THE DRAWINGS

Illustrative, non-limiting example embodiments will be more clearly understood from the following detailed description in conjunction with the accompanying drawings.

DETAILED DESCRIPTION OF EMBODIMENTS

Hereinafter, embodiments of the present inventive concept will be explained in detail with reference to the accompanying drawings.

Herein, the term "touch antenna array" refers to an apparatus that includes an arrangement of conductive elements in which at least a first portion forms an antenna array and a second portion forms a touch sensor for a touch screen or touch panel. In some embodiments, the conductive elements forming the antenna array are independent of other conductive elements forming the touch sensor, but may overlay the touch screen or touch panel. In other embodiments, at least some of the conductive elements forming the antenna array also form a portion of the touch sensor.

Figure 1:
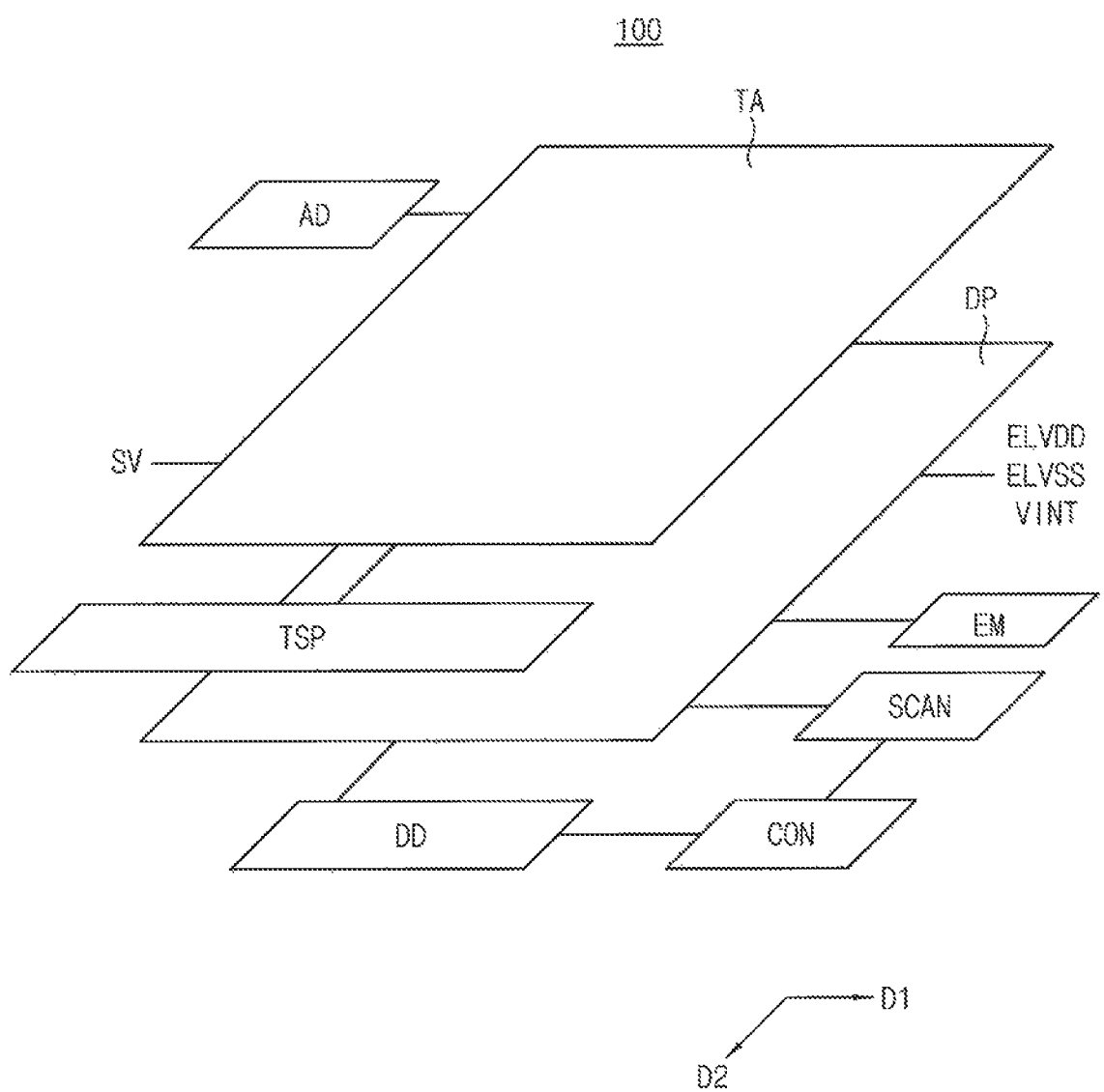
FIG. 1 is a block diagram schematically illustrating a display apparatus according to example embodiments.

FIG. 1 is a block diagram schematically illustrating exemplary components of a display apparatus, 100, according to example embodiments. The display apparatus may include a display panel DP, a scan driver SCAN, a data driver DD, an emission control driver EM, a controller CON, a touch antenna array TA described hereafter, a touch driver TSP, and an antenna driver AD.

The display panel DP may include a plurality of pixels for displaying an image. For example, the display panel DP may include n×m pixels (where n and m are each integers greater than 1) located at intersecting portions of scan lines extending in a first direction D1 and data lines extending in a second direction D2 perpendicular to the first direction D1.

Various known structures may be utilized for the structure of the pixel, and detailed descriptions thereof will be omitted.

The scan driver SCAN may sequentially provide a scan signal to the pixels through the scan lines based on a control signal received from the controller CON.

The data driver DD may provide a data signal to the pixels through the data lines based on a control signal received from the controller CON.

The emission control driver EM may sequentially provide an emission control signal to the pixels through emission control lines based on a control signal received from the controller CON.

The controller CON may control the scan driver SCAN, the data driver DD, and the emission control driver EM. The controller CON may generate the control signals to control the scan driver SCAN, the data driver DD, and the emission control driver EM.

In addition, the display apparatus may further include a power supply unit (not shown) configured to supply a first power supply voltage ELVDD, a second power supply voltage ELVSS, and an initialization voltage VINT to the display panel DP.

The touch antenna array TA may include a touch electrode comprising a plurality of touch electrode elements for a touch input function and an "antenna electrode" (interchangeably, "antenna array") which comprises a plurality of antenna elements for a communication function. The touch antenna array TA may further include a touch wiring, a ground wiring, an antenna feed network (hereafter, "feeder"), and a shielding electrode.

The touch wiring may be electrically connected to the touch electrode. A ground or fixed voltage SV may be applied to the ground wiring. In an example embodiment, the ground voltage or fixed voltage SV may be the same voltage as either the first power supply voltage ELVDD, the second power supply voltage ELVSS, or the initialization voltage VINT.

The feeder may be electrically connected to the antenna electrode. The shielding electrode may be electrically connected to the ground wiring, and may be disposed between the touch wiring and the feeder. An example of the touch antenna array TA will be described in detail below with reference to FIGS. 2 and 3.

The touch driver TSP may transmit an electrical signal to the touch electrode, and may receive an electrical signal from the touch electrode to detect a touch of a user.

The antenna driver AD may transmit an electrical signal (e.g., a radio frequency (RF) signal) to the antenna electrode, and/or may receive an RF signal from the antenna electrode to perform a transmission/reception communication function. An RF signal may be a signal at any suitable frequency to be wirelessly transmitted/received to/from another device, and may range from a sub-microwave frequency (below about 1 GHz) to millimeter wave frequencies (above about 30 GHz). The transmission/reception communication function may be a far field communication function, or a near field communication function, depending on the embodiment.

The antenna driver AD may include a radio frequency integrated circuit (RFIC) configured to feed power to and/or receive power from the antenna electrode. The RFIC may include a high-power amplifier (HPA) and a low-noise amplifier (LNA). In this case, a transmission signal transmitted through the HPA may be radiated through the antenna electrode, and a reception signal received through the antenna electrode may be amplified through the LNA.

Figure 2:
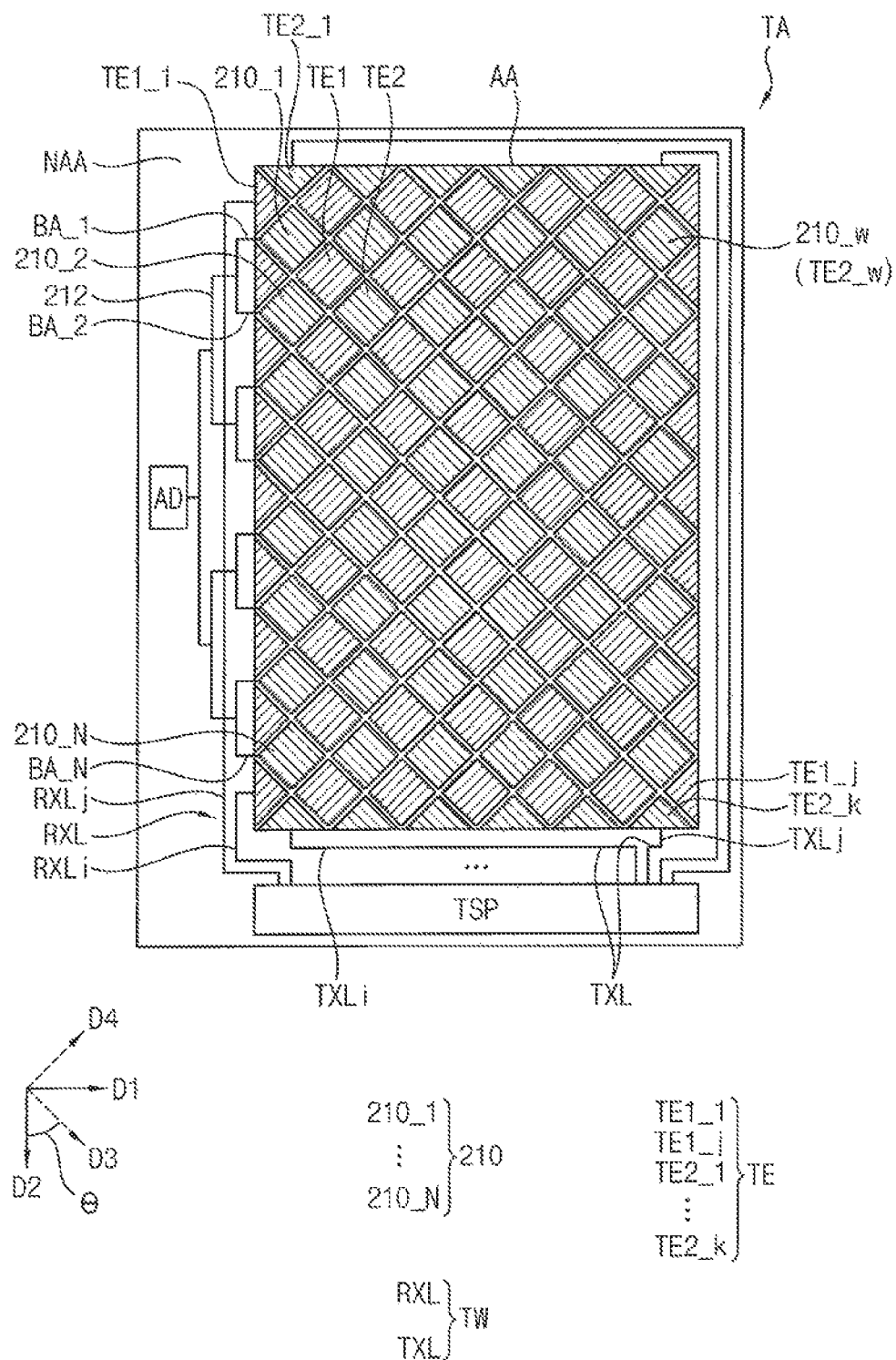
FIG. 2 is a plan view illustrating a touch antenna array in FIG. 1.

FIG. 2 is a plan view illustrating an example touch antenna array of the display apparatus 100 in FIG. 1.

Referring to FIGS. 1 to 2, the touch antenna array TA of the display apparatus 100 may include an antenna array 210 comprising a plurality N of antenna electrodes 210_1 to 210_N, and a touch electrode TE including a plurality of touch electrodes such as TE1-1 in the upper left corner and TE2-k in the lower right corner, which are disposed in a display area AA. The touch antenna array TA may include a touch driver TSP configured to drive the touch electrode TE disposed in a non-display area NAA and an antenna driver AD configured to drive the antenna electrode 210. (Although the TSP is depicted separate from the touch antenna array TA in the embodiment depicted in FIG. 1, it may be part of the touch antenna array TA as illustrated in the embodiment of FIG. 2.) The touch antenna array TA may further include a feeder 212, a touch wiring TW including a first touch wiring RXL and a second touch wiring TXL, a ground wiring, and a shielding electrode electrically connected to the ground wiring.

The display apparatus may include the display area AA in which an image is displayed and the non-display area NAA adjacent to and making contact with the display area AA on a plane defined by the first direction D1 and the second direction D2 perpendicular to the first direction D1. The display area AA may be an area in which the pixels of the display panel DP are disposed to display an image, and may receive a touch input of the user. The non-display area NAA may be an area in which no image is displayed, and may be covered by a light blocking portion (not shown) or disposed on a rear side of the display area AA as will be described below with reference to FIG. 18.

The touch electrode TE may include first touch electrodes TE1 and second touch electrodes TE2 arranged in alternating columns respect to the direction D1, and in alternating rows with respect to the direction D2. In the illustrated example, each of the first and second touch electrodes TE1 and TE2 has a rhomboid shape such as a square (except for the electrodes at the edges of the display area, which may be triangular), with a first set of opposite corners being aligned in the D1 direction and the other set of opposite corners aligned in the D2 direction. The first touch electrodes TE1 may be electrically connected to each other in the first direction D1 (i.e., row direction). The first touch electrodes TE1 may be electrically connected to the first touch wiring RXL. The touch wiring may be electrically connected to the touch driver TSP.

The second touch electrodes TE2 may be electrically connected to each other in the second direction D2 (i.e., column direction). The second touch electrode TE2 may be electrically connected to the second touch wiring TXL.

Each of the first and second electrodes TE1 and TE2 may be smaller than a touch region of user's finger or touch device. Thus, a user's touch typically changes impedance (e.g. capacitance or resistance) of a region of at least one first electrode TE1 and a region of at least one proximate second electrode TE2. By electrically connecting each of the first touch electrodes TE1 of each respective row, and electrically connecting each of the second electrodes TE2 of each respective column as described above, coordinates of the touch location in the D1 and D2 directions may be determined. For instance, when a user touches a region overlapping at least one first touch electrode TE1 and at least one second touch electrode TE2, the row and column of the touch may be detected through a combination of a detected impedance changes through the first touch wires RXL and the second touch wires TXL. For instance, if one of the first touch wires RXLi and one of the second touch wires TXLi each detect an impedance change, the TSP may determine that a touch occurred in the lower left hand corner of the display area AA.

Each of the touch electrodes TE1 and TE2 may have a rectangular, square of other shape, may have sides parallel to the first direction D1 and the second direction D2 perpendicular to the first direction D1, or may be inclined with respect to the first direction D1 and the second direction D2. In the example of FIG. 2, each of the touch electrodes TE1 and TE2 has sides inclined with respect to the directions D1 and D2 by an angle θ (e.g., 45° in the case of square shapes) such that a first set of opposite sides of each square shape is parallel to a direction D3 and the other set of opposite sides is parallel to a direction D4.

The antenna electrode 210 may be disposed in the display area AA adjacent to the non-display area NAA. The antenna electrode 210 may be spaced from the touch electrode TE when viewed in a plan view so as not to overlap the touch electrode TE. The antenna electrode 210 may be electrically connected to the feeder 212. The feeder 212 may be electrically connected to the antenna driver AD.

The antenna electrode 210 may be comprised of a linear array of N antenna electrodes (hereafter, "antenna elements") 210_1 to 210_N. The feeder 212 may be a combiner and/or divider network with branch arms BA_1 to BA_N that are connected to the antenna elements 210_1 to 210_N, respectively. The feeder 212 may divide a transmit direction RF signal inputted from the antenna driver AD into a plurality N divided signals at the branch arms BA_1 to BA-N, respectively. In the receive direction, the feeder 212 may serve as a combiner to combine N signals received from the antenna elements 210_1 to 210_N, respectively, and provide the combined signal to the antenna driver AD. Each antenna element 210_i (i=any one of 1 to N) may be a patch antenna element having a square shape (as depicted in FIG. 2), or a rectangular or other shape. The patch antenna element itself may configured as a grid of conductive elements, allowing light to pass from the display. (See FIG. 13.) Each antenna element 210_i may have one pair of opposite sides parallel to the third direction D3 and another pair of opposite sides parallel to the fourth direction D4 as illustrated, or the respective sides may be parallel to the first and second directions D1 and D2 in alternative arrangements. The shape and size of an antenna aperture defined by all of the antenna elements 210_1 to 210_N constituting the antenna electrode 210 may be appropriately designed according to an operating frequency band to be used by the antenna electrode 210.

For example, each antenna element 210 may have conductors arranged in a repetitive pattern shape, and the touch electrodes TE1 and TE2 may have the same pattern shape as the antenna electrode 210. The pattern shape of the antenna element 210 may be a lattice or mesh pattern.

In other words, most of the repeating pattern shape in the form of a lattice or mesh disposed in the display area AA may constitute the touch electrode, and a portion of the pattern shape adjacent to the non-display area NAA may constitute the antenna electrode 210.

In the embodiment illustrated in FIG. 2, the antenna electrode 210 is a linear array of antenna elements 210_1 to 210_N linearly arranged in the direction D2. In some embodiments, the antenna elements 210_1 to 210_N are not used to detect user touch inputs in the regions they occupy, and are therefore not electrically connected to the first touch wiring RXL or TXL (as illustrated in FIG. 2). However, if a user touches a region of an antenna element 210, the user's touch will typically extend to two or more adjacent touch electrodes TE1, and a precise touch point may still be determined by interpolation.

The antenna electrode 210 may be a patterned portion of a conductive layer disposed between insulating layers. The conductive layer may include one or a combination of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and/or an alloy thereof. In addition, the conductive layer may be formed by using transparent metal oxide such as indium tin oxide (ITO), indium zinc oxide (IZO), indium zinc tin oxide (ITZO), and zinc oxide ($ZnO_x$).

When the antenna electrode 210 is implemented with a silver (Ag) material, the antenna electrode 210 has excellent transparency and excellent electrical characteristics such as antenna radiation characteristics. In addition, the silver (Ag) material may be implemented with the narrowest line width and the lattice (or mesh) may be implemented with the finest spacing as compared to that achievable with other materials. Therefore, in a millimeter-wave band of a 28 GHz or 39 GHz frequency band, for example, the antenna electrode 210 and the feeder 212 having a narrow line width can be designed by using the silver material.

Meanwhile, the antenna electrode 210 and the feeder 212 may be implemented in the form of a metal mesh. In this case, the antenna electrode 210 and the feeder 212 may be implemented such that the metal mesh is electrically connected, and a dielectric area in which the antenna electrode 210 and the feeder 212 are not provided may be implemented such that the metal mesh is removed. In another example embodiment, the metal mesh may be adjacent to the antenna electrode 210 and the feeder 212 even in the dielectric area to the extent that the metal mesh does not electrically affect the antenna electrode 210 and the feeder 212. Although the metal mesh disposed in the dielectric area is not an area in which a signal is transmitted or radiated, since the metal mesh is disposed in the dielectric area, the metal mesh may be uniformly disposed over an entire area of the display apparatus, so that visibility of the display apparatus can be improved.

Meanwhile, the shape and arrangement of the touch electrode TE and the antenna electrode 210 may vary by design to achieve desirable objectives.

The touch driver TSP may be disposed in the non-display area NAA. The touch driver TSP may be configured as an integrated circuit directly mounted on the touch antenna array TA, or may have a configuration in which a pad electrode is formed on the touch antenna array TA and the touch antenna array TA is connected to a separate driving substrate through the pad electrode.

The antenna driver AD may be disposed in the non-display area NAA. The antenna driver AD may be configured as an integrated circuit directly mounted on the touch antenna array TA, or may have a configuration in which a pad electrode is formed on the touch antenna array TA and the touch antenna array TA is connected to a separate driving substrate through the pad electrode.

The touch wiring, the ground wiring, the feeder 212, and the shielding electrode may be disposed in the non-display area NAA.

Although one feeder 212 has been described as being connected to one antenna electrode in the illustrated example, at least two feeders may be connected to one antenna electrode so as to perform dual feeding. For instance one feeder 212 may be used for transmitting signals from a first set of antenna elements of the antenna electrode 210 and another feeder 212 may be used for receiving signals from a second set of antenna elements of the antenna electrode 210, where the first and second sets of antenna elements may be the same in some embodiments and may be different in other embodiments.

Figure 3:
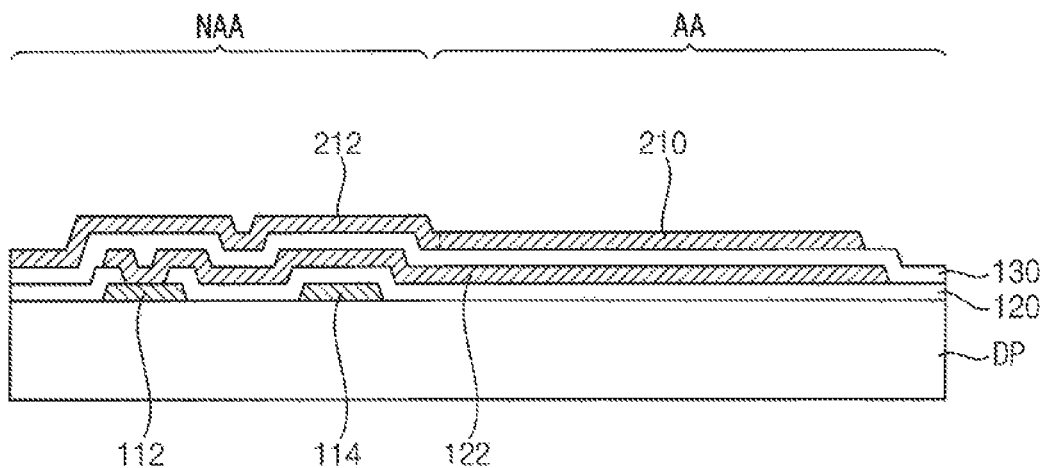
FIG. 3 is a cross-sectional diagram taken along an antenna electrode and a feeder of the display apparatus of FIG. 1.

FIG. 3 is a cross-sectional diagram taken along an antenna electrode 210 and a feeder 212 of the display apparatus of FIG. 1.

Referring to FIGS. 1 to 3, the display apparatus may include a display panel DP, a first conductive layer, a first insulating layer 120, a second conductive layer, a second insulating layer 130, and a third conductive layer. The first conductive layer may include a ground wiring 112 and a touch wiring 114. The second conductive layer may include a shielding electrode 122. The third conductive layer may include an antenna electrode 210 and a feeder 212.

The first conductive layer may be disposed on the display panel DP. The first conductive layer may include one or more of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and/or an alloy thereof. In addition, the first conductive layer may be formed by using transparent metal oxide such as indium tin oxide (ITO), indium zinc oxide (IZO), indium zinc tin oxide (ITZO), and zinc oxide ($ZnO_x$).

The first conductive layer may include the ground wiring 112 and the touch wiring 114 which are disposed in the non-display area NAA.

A ground voltage or a fixed voltage may be applied to the ground wiring 112. The ground or fixed voltage may be a first power supply voltage ELVDD, a second power supply voltage ELVSS, or an initialization voltage VINT for driving the display panel DP when embodied as an organic light emitting diode display panel.

The touch wiring 114 may be spaced apart from the ground wiring 112. The touch wiring 114 may be electrically connected to the touch electrode.

The first insulating layer 120 may be disposed on the first conductive layer. The first insulating layer 120 may include an inorganic insulating material such as a silicon compound and metal oxide. For example, the first insulating layer 120 may be formed of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. The first insulating layer 120 may include a plurality of layers. According to another example embodiment, the first insulating layer 120 may include an organic insulating material.

The second conductive layer may be disposed on the first insulating layer 120. The second conductive layer may include one or more or silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and/or an alloy thereof. In addition, the second conductive layer may be formed by using transparent metal oxide such as indium tin oxide (ITO), indium zinc oxide (IZO), indium zinc tin oxide (ITZO), and zinc oxide ($ZnO_x$).

The second conductive layer may include the shielding electrode 122. The shielding electrode 122 may be electrically connected to the ground wiring 112 through a contact hole formed through the first insulating layer 120. A portion of the shielding electrode 122 may be disposed in the non-display area NAA to overlap the touch wiring 114, and a portion of the shielding electrode 122 may be disposed in the display area AA to overlap the antenna electrode 210.

The second insulating layer 130 may be disposed on the first insulating layer 120 on which the second conductive layer is disposed. The second insulating layer 130 may include an inorganic insulating material such as a silicon compound and metal oxide. For example, the second insulating layer 130 may be formed of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. The second insulating layer 130 may include a plurality of layers. In another example embodiment, the second insulating layer 130 may include an organic insulating material.

The third conductive layer may be disposed on the second insulating layer 130. The third conductive layer may include one or more of silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), and/or an alloy thereof. In addition, the third conductive layer may be formed by using transparent metal oxide such as indium tin oxide (ITO), indium zinc oxide (IZO), indium zinc tin oxide (ITZO), and zinc oxide ($ZnO_x$).

The third conductive layer may include the antenna electrode 210 disposed in the display area AA and the feeder 212 disposed in the non-display area NAA. The antenna electrode 210 and the feeder 212 may be connected to each other.

Accordingly, the shielding electrode 122 may be electrically connected to the ground wiring 112, and may be disposed between the touch wiring 114 and the feeder 212.

According to the embodiment, the display apparatus 100 includes the display panel DP configured to display an image and the touch antenna array TA disposed on the display panel DP. The touch antenna array includes the touch electrode TE and the antenna electrode 210 to perform a touch function and an antenna function. In this case, since the shielding electrode to which the ground voltage or the constant voltage is applied is disposed between the touch wiring electrically connected to the touch electrode and the feeder electrically connected to the antenna electrode, a signal distortion problem caused by a coupling capacitance between the touch wiring and the feeder, which are driven at different frequencies and voltages, can be prevented.

Figure 4:
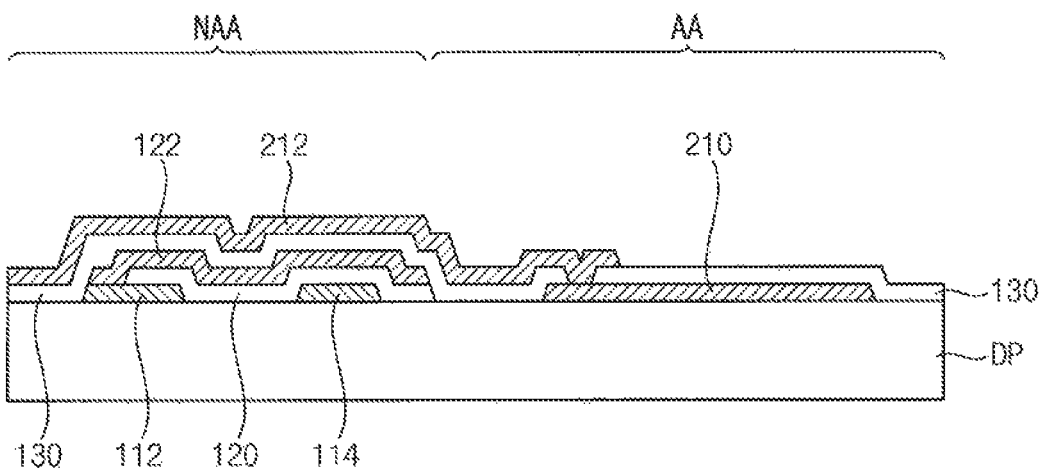
FIG. 4 is a cross-sectional diagram taken along an antenna electrode and a feeder of a display apparatus according to example embodiments.

FIG. 4 is a cross-sectional diagram taken along an antenna electrode and a feeder of a display apparatus according to example embodiments.

Referring to FIG. 4, the display apparatus is substantially the same as the display apparatus of FIGS. 1 to 3 except for a stacked structure of the ground wiring 112, the touch wiring 114, the shielding electrode 122, the antenna electrode 210, and the feeder 212. Therefore, redundant descriptions thereof will be omitted.

The display apparatus may include a display panel DP, a first conductive layer, a first insulating layer 120, a second conductive layer, a second insulating layer 130, and a third conductive layer. The first conductive layer may include a ground wiring 112, a touch wiring 114, and an antenna electrode 210. The second conductive layer may include a shielding electrode 122. The third conductive layer may include a feeder 212.

The first conductive layer may be disposed on the display panel DP. The first conductive layer may include the ground wiring 112 and the touch wiring 114, which are disposed in the non-display area NAA, and the antenna electrode 210 disposed in the display area AA.

The first insulating layer 120 may be disposed on the first conductive layer. In detail, the first insulating layer 120 may expose the ground wiring 112, and may cover and insulate the touch wiring 114. For example, the first insulating layer 120 may completely cover the touch wiring 114, may expose a portion of the ground wiring 112, and may not be formed in the display area AA when viewed in a sectional view.

The second conductive layer may be disposed on the display panel DP on which the first insulating layer 120 is disposed. The second conductive layer may include the shielding electrode 122 disposed in the non-display area NAA. The shielding electrode 122 may be electrically connected to the ground wiring 112 exposed by the first insulating layer 120. The shielding electrode 122 may be disposed in the non-display area NAA to overlap the touch wiring 114. In other words, the shielding electrode 122 may cover the touch wiring 114 while being insulated from the touch wiring 114 by the first insulating layer 120.

The second insulating layer 130 may be disposed on the first insulating layer 120 on which the second conductive layer is disposed.

The third conductive layer may be disposed on the second insulating layer 130. The third conductive layer may include the feeder 212 disposed in the non-display area NAA. The feeder 212 may extend to the antenna electrode 210 in the display area AA so as to be electrically connected to the antenna electrode 210 through a contact hole formed through the second insulating layer 130.

Figure 5:
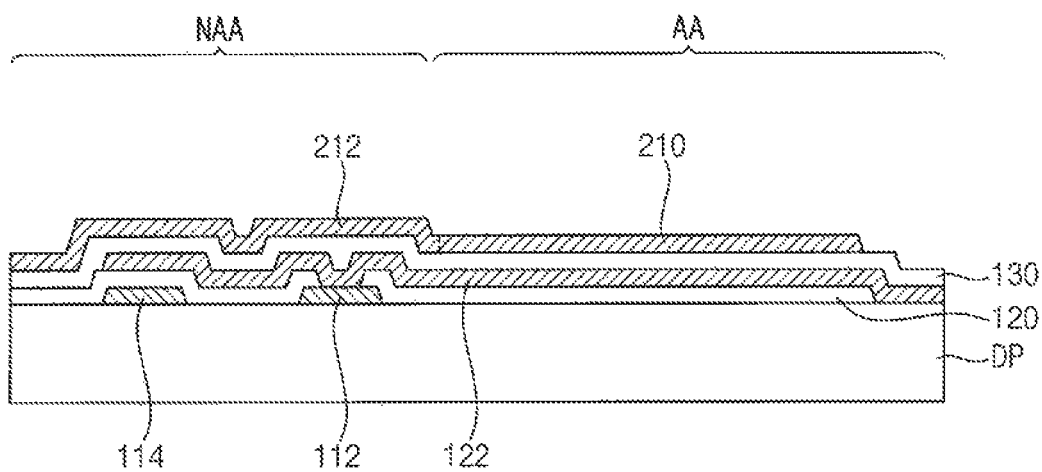
FIG. 5 is a cross-sectional diagram taken along an antenna electrode and a feeder of a display apparatus according to example embodiments.

FIG. 5 is a cross-sectional diagram taken along an antenna electrode and a feeder of a display apparatus according to example embodiments.

Referring to FIG. 5, the display apparatus is substantially the same as the display apparatus of FIGS. 1 to 3 except for a stacked structure of the ground wiring 112, the touch wiring 114, the shielding electrode 122, the antenna electrode 210, and the feeder 212. Therefore, redundant descriptions thereof will be omitted.

The display apparatus may include a display panel DP, a first conductive layer, a first insulating layer 120, a second conductive layer, a second insulating layer 130, and a third conductive layer. The first conductive layer may include a ground wiring 112, a touch wiring 114, and an antenna electrode 210. The second conductive layer may include a shielding electrode 122. The third conductive layer may include an antenna electrode 210 and a feeder 212.

The first conductive layer may be disposed on the display panel DP. The first conductive layer may include the ground wiring 112 and the touch wiring 114 which are disposed in the non-display area NAA. The ground wiring 112 may be disposed between the touch wiring 114 and the display area AA.

The first insulating layer 120 may be disposed on the first conductive layer.

The second conductive layer may be disposed on the first insulating layer 120. The second conductive layer may include the shielding electrode 122 disposed over the non-display area NAA and the display area AA. The shielding electrode 122 may be electrically connected to the ground wiring 112 through a contact hole formed through the first insulating layer 120. The shielding electrode 122 may extend in left and right directions in the drawing so as to overlap the touch wiring 114 and overlap the antenna electrode 210 in the display area AA.

The second insulating layer 130 may be disposed on the first insulating layer 120 on which the second conductive layer is disposed.

The third conductive layer may be disposed on the second insulating layer 130. The third conductive layer may include the feeder 212 disposed in the non-display area NAA and the antenna electrode 210 disposed in the display area AA. The antenna electrode 210 and the feeder 212 may be connected to each other.

Figure 6:
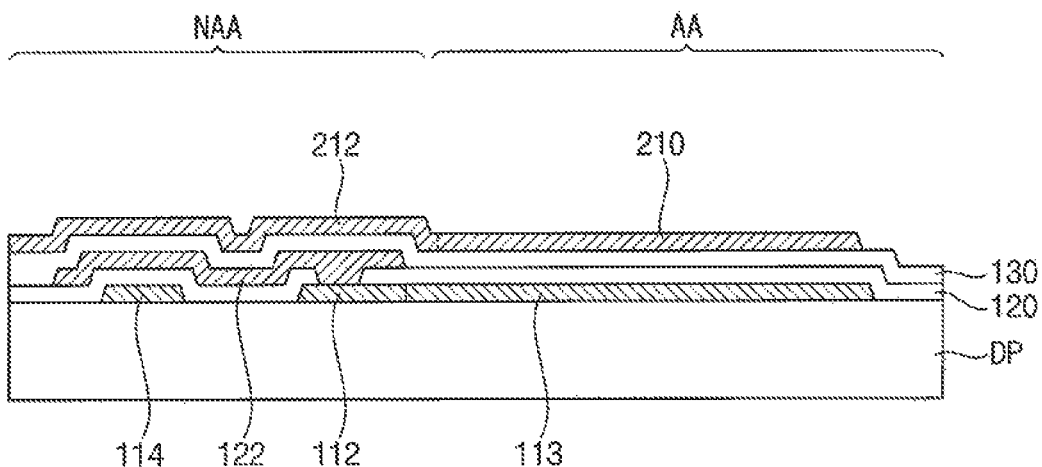
FIG. 6 is a cross-sectional diagram taken along an antenna electrode and a feeder of a display apparatus according to example embodiments.

FIG. 6 is a cross-sectional diagram taken along an antenna electrode and a feeder of a display apparatus according to example embodiments.

Referring to FIG. 6, the display apparatus is substantially the same as the display apparatus of FIGS. 1 to 3 except for a stacked structure of the ground wiring 112, the touch wiring 114, the shielding electrode 122, the antenna electrode 210, and the feeder 212. Therefore, redundant descriptions thereof will be omitted.

The display apparatus may include a display panel DP, a first conductive layer, a first insulating layer 120, a second conductive layer, a second insulating layer 130, and a third conductive layer. The first conductive layer may include a ground wiring 112 and a touch wiring 114. The second conductive layer may include a shielding electrode 122. The third conductive layer may include an antenna electrode 210 and a feeder 212.

The first conductive layer may be disposed on the display panel DP. The first conductive layer may include the ground wiring 112 and the touch wiring 114 which are disposed in the non-display area NAA. The ground wiring 112 may be disposed between the touch wiring 114 and the display area AA, and a shielding portion 113 which overlaps the antenna electrode 210 in the display area AA may extend from the ground wiring 112.

The first insulating layer 120 may be disposed on the first conductive layer.

The second conductive layer may be disposed on the first insulating layer 120. The second conductive layer may include the shielding electrode 122 disposed in the non-display area NAA. The shielding electrode 122 may be electrically connected to the ground wiring 112 through a contact hole formed through the first insulating layer 120. The shielding electrode 122 may overlap the touch wiring 114.

The second insulating layer 130 may be disposed on the first insulating layer 120 on which the second conductive layer is disposed.

The third conductive layer may be disposed on the second insulating layer 130. The third conductive layer may include the feeder 212 disposed in the non-display area NAA and the antenna electrode 210 disposed in the display area AA. The antenna electrode 210 and the feeder 212 may be connected to each other.

Figure 7:
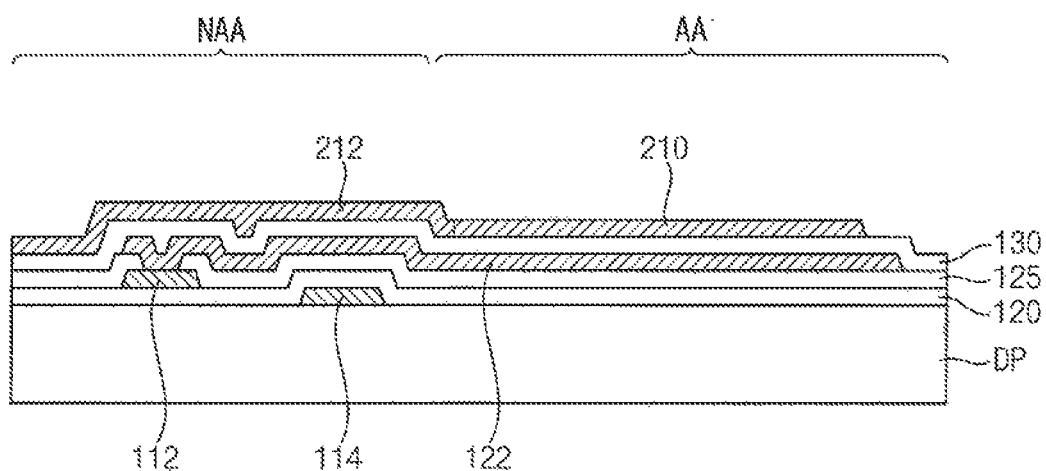
FIG. 7 is a cross-sectional diagram taken along an antenna electrode and a feeder of a display apparatus according to example embodiments.

FIG. 7 is a cross-sectional diagram taken along an antenna electrode and a feeder of a display apparatus according to example embodiments.

Referring to FIG. 7, the display apparatus is substantially the same as the display apparatus of FIGS. 1 to 3 except for a stacked structure of the ground wiring 112, the touch wiring 114, the shielding electrode 122, the antenna electrode 210, and the feeder 212. Therefore, redundant descriptions thereof will be omitted.

The display apparatus may include a display panel DP, a first conductive layer, a first insulating layer 120, a second conductive layer, an intermediate insulating layer 125, a third conductive layer, a second insulating layer 130, and a fourth conductive layer. The first conductive layer may include a touch wiring 114. The second conductive layer may include a ground wiring 112. The third conductive layer may include a shielding electrode 122. The fourth conductive layer may include an antenna electrode 210 and a feeder 212.

The first conductive layer may be disposed on the display panel DP. The first conductive layer may include the touch wiring 114 disposed in the non-display area NAA.

The first insulating layer 120 may be disposed on the first conductive layer.

The second conductive layer may be disposed on the first insulating layer 120. The second conductive layer may include the ground wiring 112 disposed in the non-display area NAA.

The intermediate insulating layer 125 may be disposed on the first insulating layer 120 on which the second conductive layer is disposed.

The third conductive layer may be disposed on the intermediate insulating layer 125. The third conductive layer may include the shielding electrode 122 disposed over the non-display area NAA and the display area AA. The shielding electrode 122 may be electrically connected to the ground wiring 112 through a contact hole formed through the intermediate insulating layer 125. The shielding electrode 122 may overlap the touch wiring 114, and may overlap the antenna electrode 210.

The second insulating layer 130 may be disposed on the intermediate insulating layer 125 on which the third conductive layer is disposed.

The fourth conductive layer may be disposed on the second insulating layer 130. The fourth conductive layer may include the feeder 212 disposed in the non-display area NAA and the antenna electrode 210 disposed in the display area AA. The antenna electrode 210 and the feeder 212 may be connected to each other.

Figure 8:
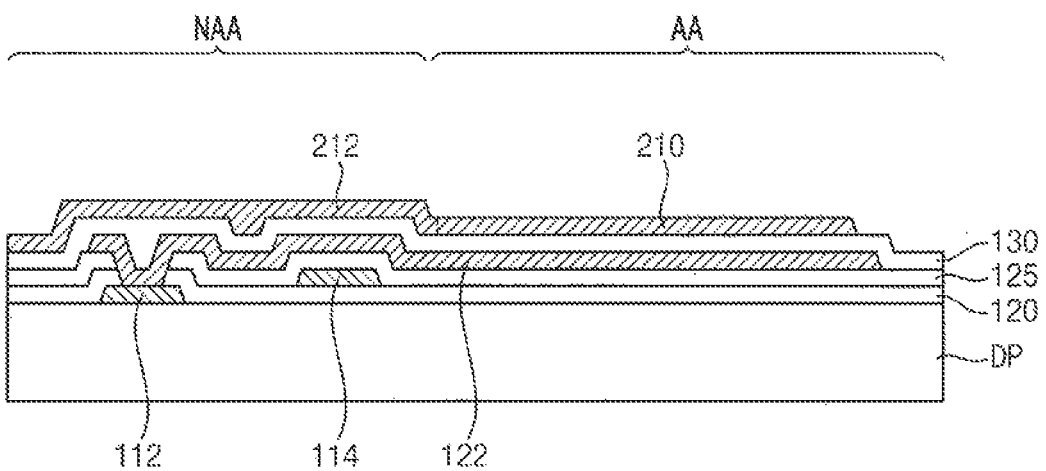
FIG. 8 is a cross-sectional diagram taken along an antenna electrode and a feeder of a display apparatus according to example embodiments.

FIG. 8 is a cross-sectional diagram taken along an antenna electrode and a feeder of a display apparatus according to example embodiments.

Referring to FIG. 8, the display apparatus is substantially the same as the display apparatus of FIG. 7 except for a stacked structure of the ground wiring 112 and the touch wiring 114. Therefore, redundant descriptions thereof will be omitted.

The display apparatus may include a display panel DP, a first conductive layer, a first insulating layer 120, a second conductive layer, an intermediate insulating layer 125, a third conductive layer, a second insulating layer 130, and a fourth conductive layer. The first conductive layer may include a ground wiring 112. The second conductive layer may include a touch wiring 114. The third conductive layer may include a shielding electrode 122. The fourth conductive layer may include an antenna electrode 210 and a feeder 212.

The shielding electrode 122 may be disposed over the non-display area NAA and the display area AA. The shielding electrode 122 may be electrically connected to the ground wiring 112 through a contact hole formed through the intermediate insulating layer 125 and the first insulating layer 120. The shielding electrode 122 may overlap the touch wiring 114, and may overlap the antenna electrode 210.

Figure 9:
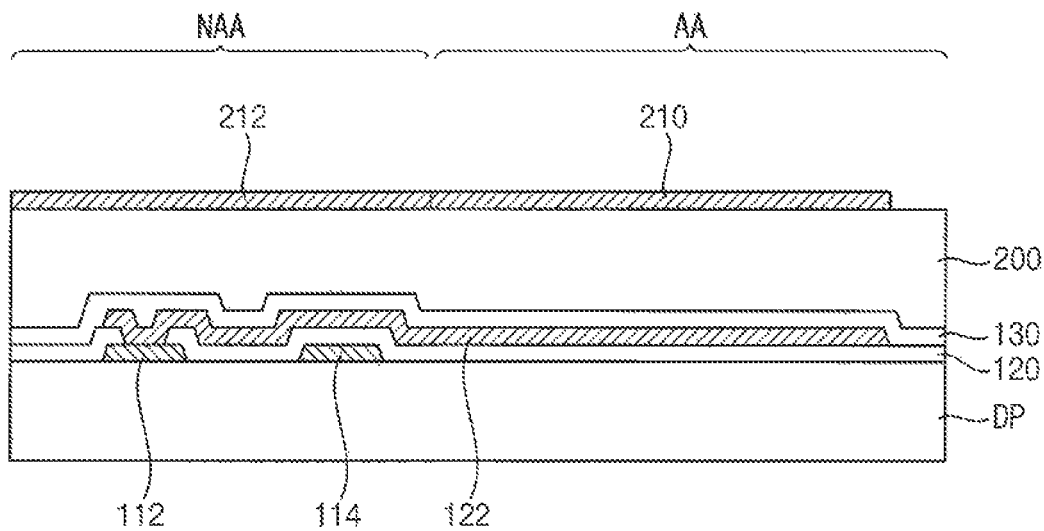
FIG. 9 is a cross-sectional diagram taken along an antenna electrode and a feeder of a display apparatus according to example embodiments.

FIG. 9 is a cross-sectional diagram taken along an antenna electrode and a feeder of a display apparatus according to example embodiments.

Referring to FIG. 9, the display apparatus is substantially the same as the display apparatus of FIG. 3 except that the third conductive layer is formed on a separate film 200 and attached to the second insulating layer 130 instead of being directly formed on the second insulating layer 130. Therefore, redundant descriptions thereof will be omitted.

The display apparatus may include a display panel DP, a first conductive layer, a first insulating layer 120, a second conductive layer, a second insulating layer 130, a base film 200, and a third conductive layer. The first conductive layer may include a ground wiring 112 and a touch wiring 114. The second conductive layer may include a shielding electrode 122. The third conductive layer may include an antenna electrode 210 and a feeder 212.

The first conductive layer, the first insulating layer 120, the second conductive layer, and the second insulating layer 130 may be formed on the display panel DP through a direct deposition process. Thereafter, an antenna array in the form of a film in which the third conductive layer is formed on the base film 200 may be attached onto the third insulating layer 130 by using an adhesive layer (not shown) such as a pressure-sensitive adhesive (PSA). For example, the base film 200 may include a transparent resin film having flexibility.

Meanwhile, in another example embodiment, the first conductive layer and the second conductive layer as well as the third conductive layer of the display apparatus may be formed on a separate base film, and attached to the display panel DP by using an adhesive layer.

Figure 10:
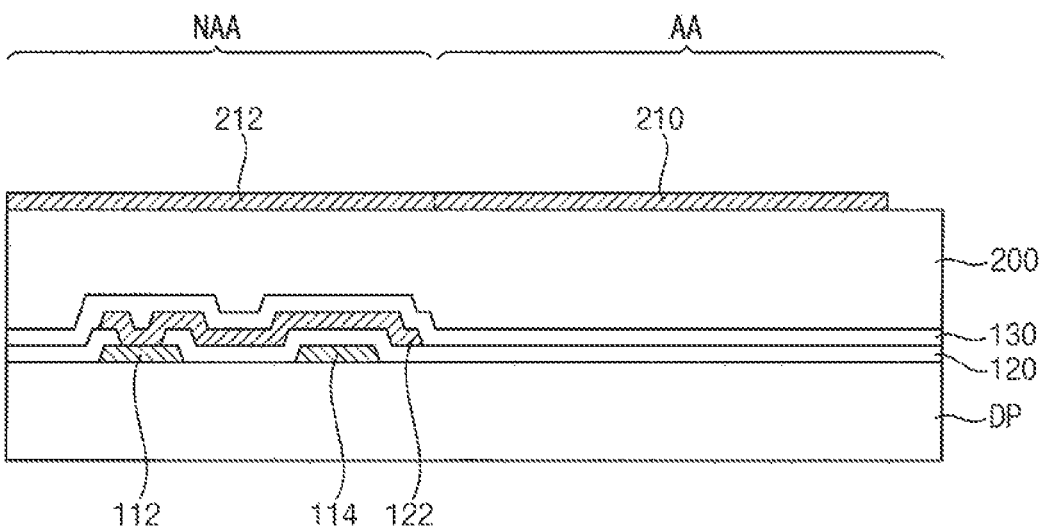
FIG. 10 is a cross-sectional diagram taken along an antenna electrode and a feeder of a display apparatus according to example embodiments.

FIG. 10 is a cross-sectional diagram taken along an antenna electrode and a feeder of a display apparatus according to example embodiments.

Referring to FIG. 10, the display apparatus is substantially the same as the display apparatus of FIG. 9 except that the shielding electrode 122 is disposed only in the non-display area NAA. Therefore, redundant descriptions thereof will be omitted.

The display apparatus may include a display panel DP, a first conductive layer, a first insulating layer 120, a second conductive layer, a second insulating layer 130, a base film 200, and a third conductive layer. The first conductive layer may include a ground wiring 112 and a touch wiring 114. The second conductive layer may include a shielding electrode 122. The third conductive layer may include an antenna electrode 210 and a feeder 212.

In order to prevent the coupling capacitance from being generated between the touch wiring 114 and the feeder 212, the shielding electrode 122 may be formed between the touch wiring 114 and the feeder 212 to cover the touch wiring 114, and may be formed only in the non-display area NAA.

Figure 11:
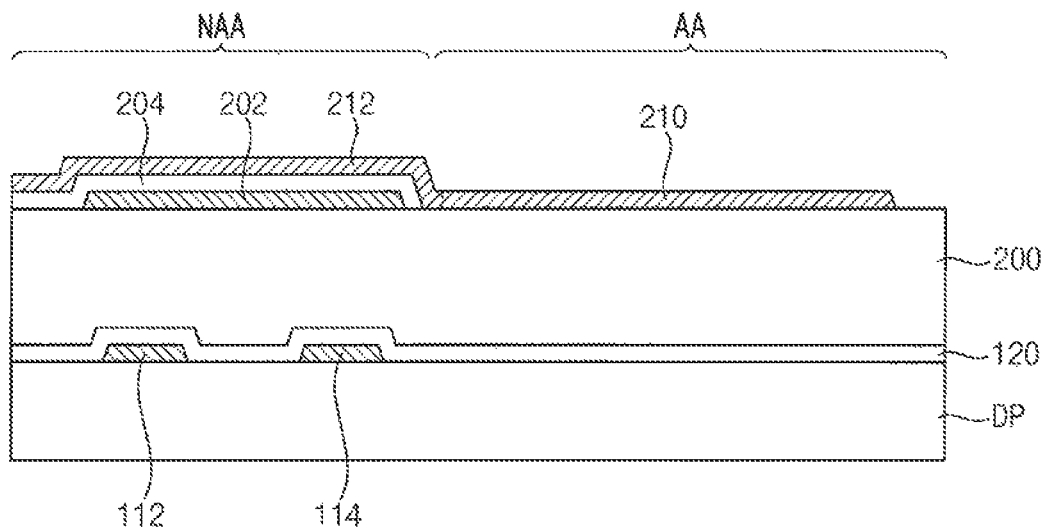
FIG. 11 is a cross-sectional diagram taken along an antenna electrode and a feeder of a display apparatus according to example embodiments.

FIG. 11 is a cross-sectional diagram taken along an antenna electrode and a feeder of a display apparatus according to example embodiments.

Referring to FIG. 11, the display apparatus may include a display panel DP, a first conductive layer, a first insulating layer 120, a base film 200, a second conductive layer, a second insulating layer 204, and a third conductive layer. The first conductive layer may include a ground wiring 112 and a touch wiring 114. The second conductive layer may include a shielding electrode 202. The third conductive layer may include an antenna electrode 210 and a feeder 212.

The first conductive layer may be disposed on the display panel DP. The first insulating layer 120 may be disposed on the first conductive layer. Thereafter, an antenna array in the form of a film in which the second conductive layer and the third conductive layer are formed on the base film 200 may be attached onto the first insulating layer 120 by using an adhesive layer (not shown).

The second conductive layer may be disposed on the base film 200. The second insulating layer 204 may be disposed on the second conductive layer. The third conductive layer may be disposed on the second insulating layer 204 and the base film 200. The shielding electrode 202 may be disposed between the feeder 212 and the touch wiring 114.

Here, the shielding electrode 202 of the second conductive layer may be electrically connected to the ground wiring 112. For example, the shielding electrode 202 and the ground wiring 112 may be electrically connected to each other through a separate connection pad (not shown), or the shielding electrode 202 and the ground wiring 112 may be electrically connected to each other through a connection electrode (not shown) provided through the first insulating layer 120 and the base film 200.

Figure 12:
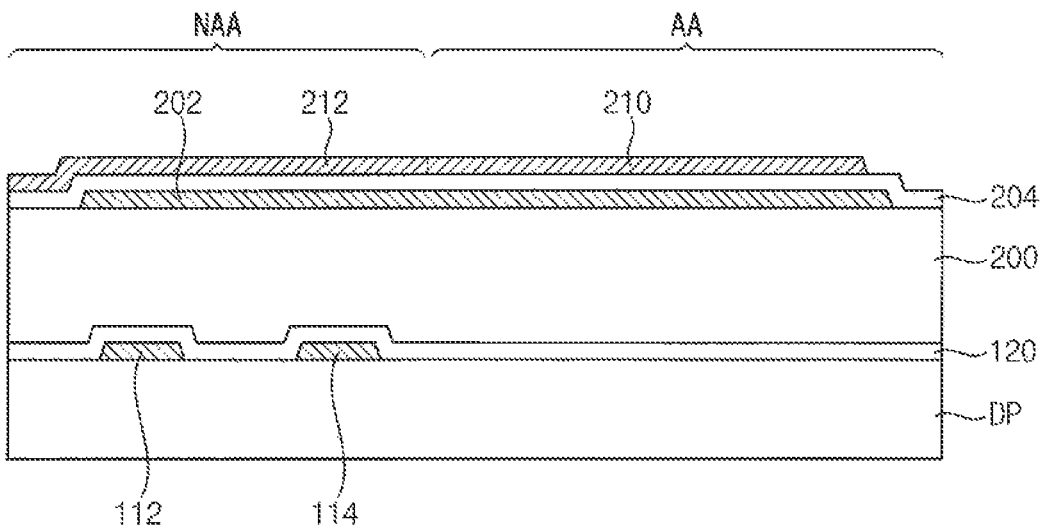
FIG. 12 is a cross-sectional diagram taken along an antenna electrode and a feeder of a display apparatus according to example embodiments.

FIG. 12 is a cross-sectional diagram taken along an antenna electrode and a feeder of a display apparatus according to example embodiments.

Referring to FIG. 12, the display apparatus is substantially the same as the display apparatus of FIG. 11 except that the shielding electrode 202 extends to the display area AA as well as the non-display area NAA to overlap the antenna electrode 210. Therefore, redundant descriptions thereof will be omitted.

The display apparatus may include a display panel DP, a first conductive layer, a first insulating layer 120, a base film 200, a second conductive layer, a second insulating layer 204, and a third conductive layer. The first conductive layer may include a ground wiring 112 and a touch wiring 114. The second conductive layer may include a shielding electrode 202. The third conductive layer may include an antenna electrode 210 and a feeder 212.

The shielding electrode 202 may be disposed between the feeder 212 and the touch wiring 114 to cover the touch wiring 114 in the non-display area NAA. The shielding electrode 202 may extend to the display area AA to overlap the antenna electrode 210.

Figure 13:
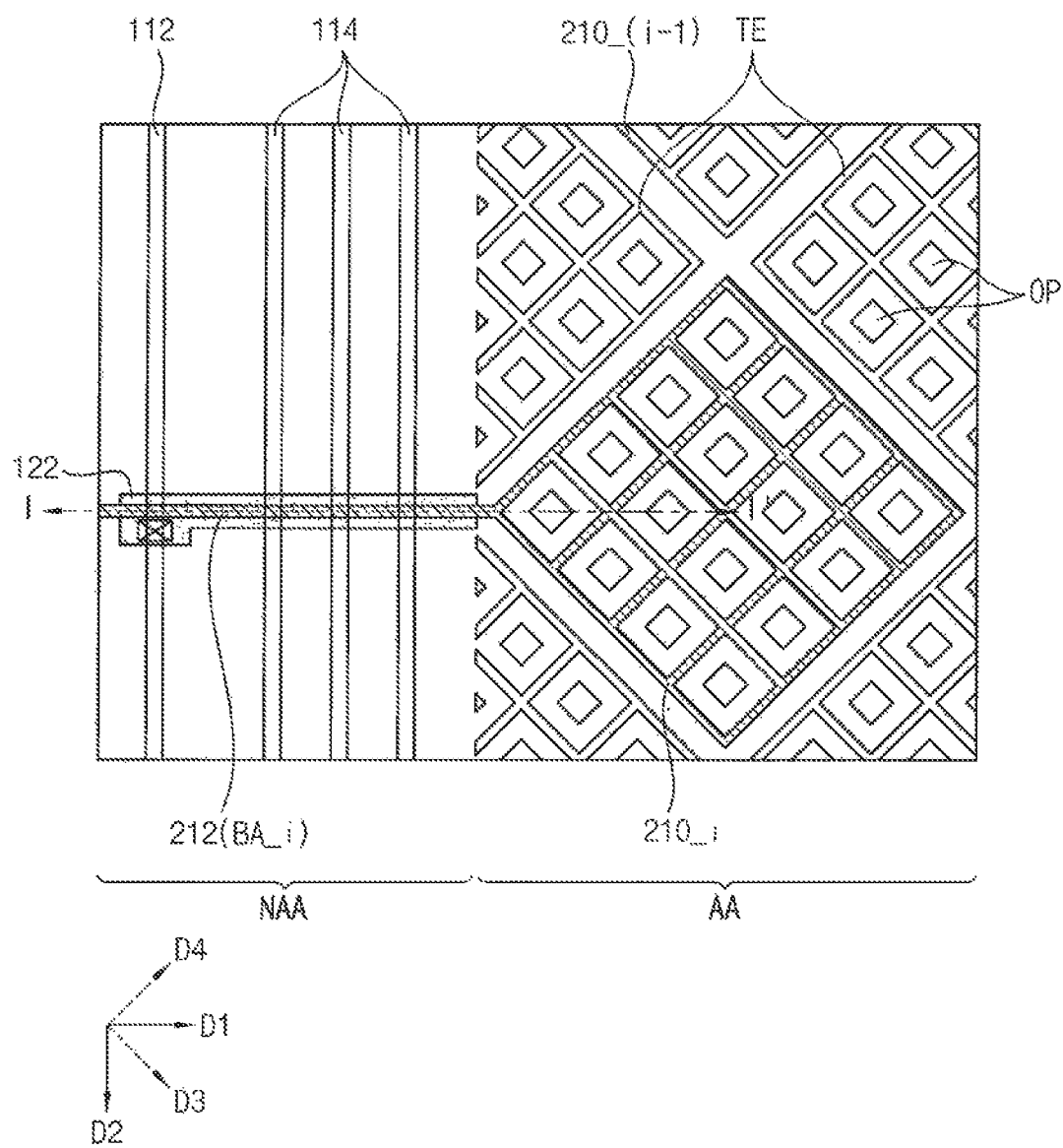
FIG. 13 is a plan view illustrating an antenna electrode and a feeder of a display apparatus according to example embodiments.
Figure 14:
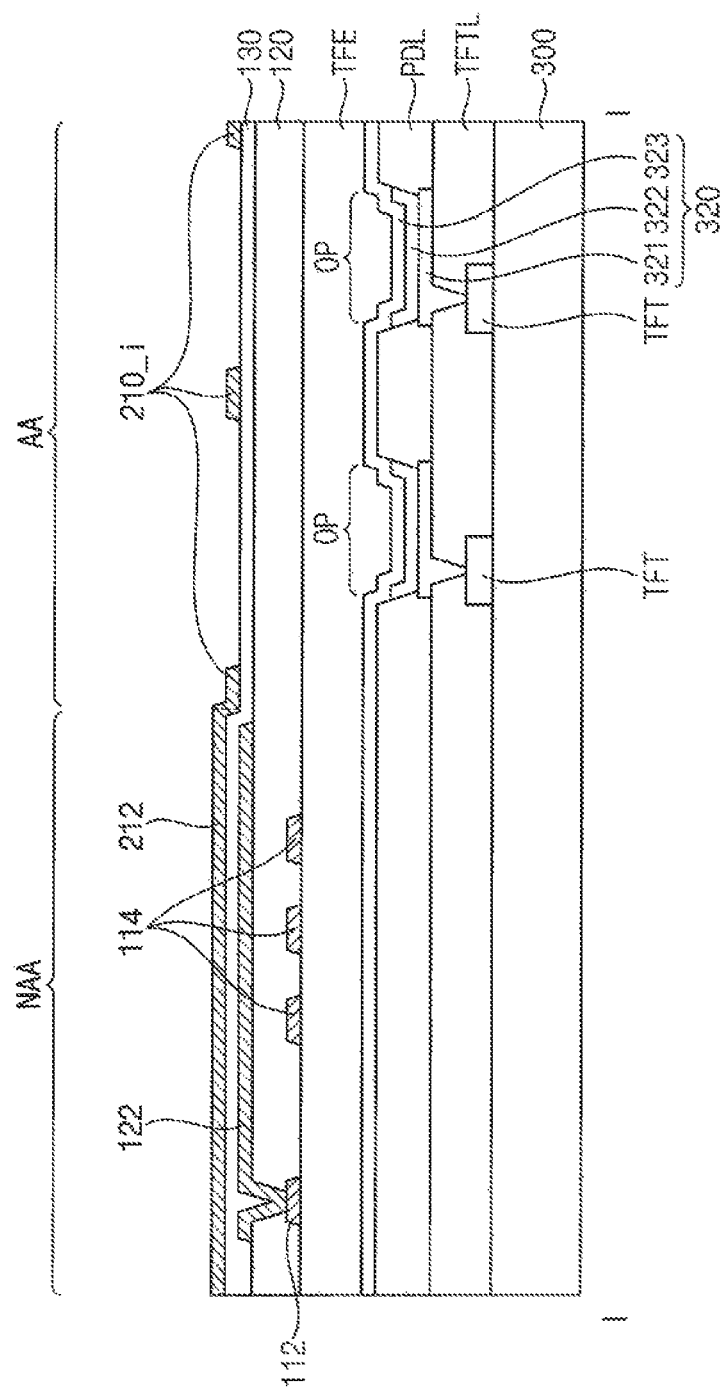
FIG. 14 is a cross-sectional diagram taken along a line I-I' in FIG. 13.

FIG. 13 is a plan view illustrating an example antenna element (electrode) 210_i and a feeder 212 of the display apparatus 100 according to example embodiments, and FIG. 14 is a cross-sectional diagram taken along a line I-I' in FIG. 13.

Referring to FIGS. 13 and 14, the display apparatus may include a substrate 300, a thin film transistor layer TFTL, a pixel defining layer PDL, a light emitting structure 320, a thin film encapsulation layer TFE, a first conductive layer, a first insulating layer 120, a second conductive layer, a second insulating layer 130, and a third conductive layer. The first conductive layer may include a touch electrode TE, a ground wiring 112, and a touch wiring 114. The second conductive layer may include a shielding electrode 122. The third conductive layer may include an antenna electrode 210 (including the antenna element 210_i) and a feeder 212. The light emitting structure 320 may include a first electrode 321, a light emitting layer 322, and a second electrode 323. A branch arm BA_i of the feeder 212 may electrically connect to a corner portion of the antenna element 210_i, thereby exciting all the conductive material of the antenna element to radiate RF signal energy in the transmit direction, and to receive energy RF signal energy in the receive direction. The antenna element 210_i may be electrically isolated in the region of the display area AA from all other antenna elements such as 210_(i-1) and from the touch electrodes TE.

The substrate 300 may be a transparent insulating substrate. The thin film transistor layer TFTL including a thin film transistor TFT may be disposed on the substrate 300. The thin film transistor layer TFTL may include a plurality of conductive layers and insulating layers to configure the thin film transistor TFT.

The first electrode 321 of the light emitting structure 320 may be disposed on the thin film transistor layer TFTL. The pixel defining layer PDL may be disposed on the thin film transistor layer TFTL on which the first electrode 321 is disposed. The pixel defining layer PDL may define an opening OP corresponding to an emission area. The light emitting layer 322 and the second electrode 323 may be disposed on the first electrode 321 in the opening OP. The thin film encapsulation layer TFE may be disposed on the light emitting structure 320.

The first conductive layer may be disposed on the thin film encapsulation layer TFE. The touch electrode TE may be disposed in the display area AA. The touch electrode TE may include first touch electrodes electrically connected to each other in the first direction D1 and second touch electrodes electrically connected to each other in the second direction D2. Each touch electrode TE may have a rhombic shape including a lattice or mesh pattern extending in a direction inclined with respect to the first direction D1 and the second direction D2.

The touch wiring 114 may be disposed in the non-display area NAA. The touch wiring 114 may be electrically connected to the touch electrode TE, where the touch electrode TE is disposed in the same layer as the touch wiring 114 in some embodiments. In other embodiments, the touch electrode TE is disposed in a different layer as that of the touch wiring 114, and connection is made therebetween through vias. The ground wiring 112 may be disposed in the non-display area NAA.

According to the above-discussed embodiment, the touch electrode TE has been described as being formed of the third conductive layer, but in other embodiments, the touch electrode TE may be formed as patterned conductive elements of the first conductive layer, the second conductive layer, or the third conductive layer, or may be formed by using at least two of the first, second, and third conductive layers.

The first insulating layer 120 may be disposed on the first conductive layer.

The second conductive layer may be disposed on the first insulating layer 120. The shielding electrode 122 may be electrically connected to the ground wiring 112 through a contact hole formed through the first insulating layer 120. The shielding electrode 122 may extend in the first direction D1 along the feeder 212 in the non-display area NAA, and may overlap the feeder 212. Accordingly, the shielding electrode 122 may be disposed between the feeder 212 and the touch wiring 114.

The second insulating layer 130 may be disposed on the second conductive layer.

The third conductive layer may be disposed on the second insulating layer 130. The antenna electrode 210 may be disposed in the display area AA. The antenna electrode 210 may have a rhombic shape including a lattice or mesh pattern extending in a direction inclined with respect to the first direction D1 and the second direction D2. In other words, the antenna electrode 210 may have a pattern shape including an opening so as not to overlap the emission area corresponding to the opening OP, and the antenna electrode 210 may have the same pattern shape as the touch electrode TE.

Although the display panel DP has been illustrated as being an organic light emitting diode display device (OLED), the embodiment is not limited thereto. In another example embodiment, the display panel DP may be a liquid crystal display device (LCD), a field emission display device (FED), a plasma display device (PDP), or an electrophoretic image display device (EPD).

Figure 15:
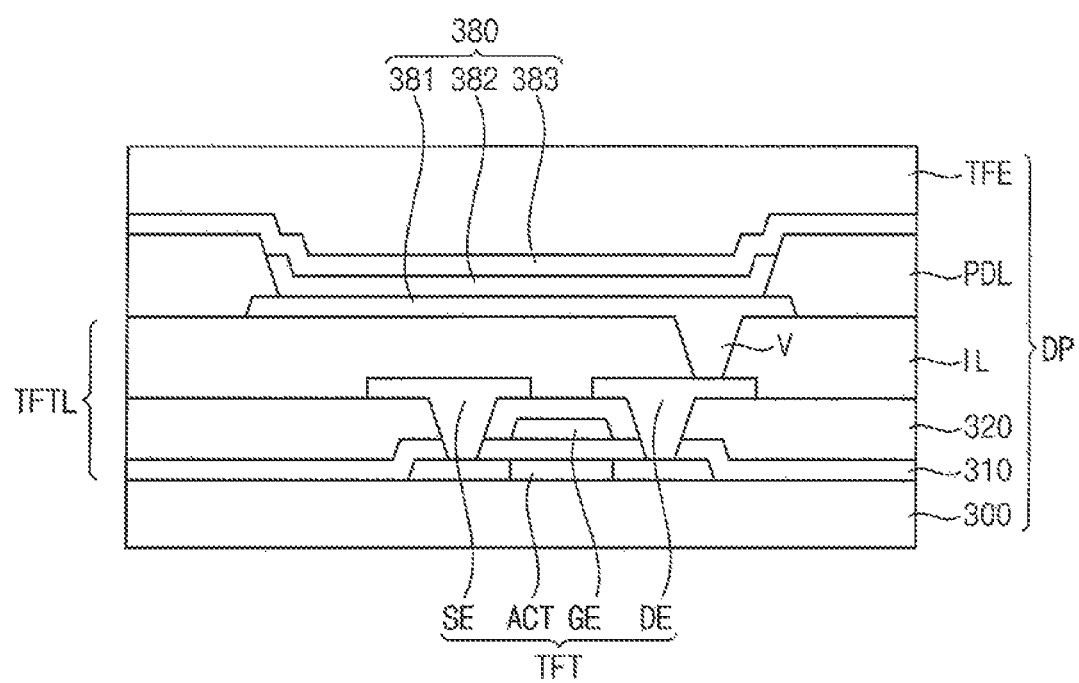
FIG. 15 is a cross-sectional diagram illustrating a display panel of a display apparatus according to example embodiments.

FIG. 15 is a cross-sectional diagram illustrating a display panel of a display apparatus according to example embodiments.

Referring to FIG. 15, the display panel DP may be an organic light emitting diode display panel. The display panel DP may include a substrate 300, a thin film transistor layer TFTL, a pixel defining layer PDL, a light emitting structure 380, a thin film encapsulation layer TFE, and the like. The thin film transistor layer TFTL may include a thin film transistor TFT, a gate insulating layer 310, an interlayer insulating layer 320, and an insulating layer IL that includes a via V. The thin film transistor TFT may include an active pattern ACT, a gate electrode GE, a source electrode SE, and a drain electrode DE. The light emitting structure 380 may include a first electrode 381, a light emitting layer 382, and a second electrode 383.

The substrate 300 may be formed of a transparent or opaque material. For example, the substrate 300 may include a quartz substrate, a synthetic quartz substrate, a calcium fluoride substrate, a fluorine-doped quartz substrate (F-doped quartz substrate), a soda lime glass substrate, a non-alkali glass substrate, and the like. In some example embodiments, the substrate 300 may be a transparent resin substrate having flexibility. Examples of the transparent resin substrate that may be used as the base substrate 300 may include a polyimide substrate.

A buffer layer (not shown) may be disposed on the substrate 300. The buffer layer may prevent metal atoms or impurities from diffusing from the substrate 300 to the thin film transistor TFT, and may control a heat transfer rate during a crystallization process for forming the active pattern ACT to obtain a substantially uniform active pattern ACT. In addition, when a surface of the substrate 300 is not uniform, the buffer layer may serve to improve flatness of the surface of the substrate 300. Depending on a type of the substrate 300, at least two buffer layers may be provided on the substrate 300, or the buffer layer may not be provided. For example, the buffer layer may include an organic material or an inorganic material.

The active pattern ACT may be disposed on the substrate 300. The active pattern ACT may include a metal oxide semiconductor, an inorganic semiconductor (e.g., amorphous silicon or poly silicon semiconductor), an organic semiconductor, or the like. The active pattern ACT may have a source region, a drain region, and a channel region disposed between the source region and the drain region.

The gate insulating layer 310 may be disposed on the active pattern ACT. For example, the gate insulating layer 310 may sufficiently cover the active pattern ACT on the substrate 300, and may have a substantially flat top surface without creating a step around the active pattern ACT. In some example embodiments, the gate insulating layer 310 may be disposed along a profile of the active pattern ACT with a uniform thickness to cover the active pattern ACT on the substrate 300. The gate insulating layer 310 may include a silicon compound, metal oxide, and the like. For example, the gate insulating layer 310 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In some example embodiments, the gate insulating layer 310 may have a multilayer structure including a plurality of insulating layers. For example, the insulating layers may have mutually different thicknesses or may include mutually different materials.

A gate pattern including the gate electrode GE may be disposed on the gate insulating layer 310. The gate pattern may overlap the channel region of the active pattern ACT. The gate electrode GE may include a metal, an alloy, metal nitride, conductive metal oxide, a transparent conductive material, and the like. For example, the gate electrode 170 may include one or more of gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. In some example embodiments, the gate pattern may include a multilayer structure including a plurality of metal layers. For example, the metal layers may have mutually different thicknesses or may include mutually different materials.

The interlayer insulating layer 320 may be disposed on the gate pattern. For example, the interlayer insulating layer 320 may sufficiently cover the gate pattern on the gate insulating layer 310, and may have a substantially flat top surface without creating a step around the gate pattern. In some example embodiments, the interlayer insulating layer 320 may be disposed along a profile of the gate pattern with a uniform thickness to cover the gate pattern on the gate insulating layer 310. The interlayer insulating layer 320 may include a silicon compound, metal oxide, and the like. In some example embodiments, the interlayer insulating layer 320 may have a multilayer structure including a plurality of insulating layers. For example, the insulating layers may have mutually different thicknesses or may include mutually different materials.

A data pattern including the source electrode SE and the drain electrode DE of the thin film transistor TFT may be disposed on the interlayer insulating layer 320. The source electrode SE may be connected to the source region of the active pattern ACT through a contact hole formed by removing first portions of the gate insulating layer 310 and the interlayer insulating layer 320, and the drain electrode DE may be connected to the drain region of the active pattern ACT through a contact hole formed by removing second portions of the gate insulating layer 310 and the interlayer insulating layer 320. Each of the data patterns may include a metal, an alloy, metal nitride, conductive metal oxide, a transparent conductive material, and the like. These may be used alone or in combination with each other. In some example embodiments, the data pattern may have a multilayer structure including a plurality of metal layers. For example, the metal layers may have mutually different thickness or may include different materials.

Accordingly, thin film transistor TFT including the active pattern ACT, the gate insulating layer 310, the gate electrode GE, the interlayer insulating layer 320, the source electrode SE, and the drain electrode DE may be provided.

Although the thin film transistor TFT has been described as having a top gate structure, the configuration of the present invention is not limited thereto. For example, the thin film transistor TFT may have a bottom gate structure, a dual gate structure, or the like.

The insulating layer IL may be disposed on the interlayer insulating layer 320 and the data pattern. For example, the insulating layer IL may have a relatively thick thickness. In this case, the insulating layer IL may have a substantially flat top surface. In order to implement such a flat top surface of the insulating layer IL, a planarization process may be additionally performed on the insulating layer IL. In some example embodiments, the insulating layer IL may be disposed along a profile of the data pattern with a uniform thickness on the interlayer insulating layer 320. The insulating layer IL may be formed of an organic material or an inorganic material. In example embodiments, the insulating layer IL may include an organic material. For example, the insulating layer IL may include a photoresist, a polyacryl-based resin, a polyimide-based resin, a polyamide-based resin, a siloxane-based resin, an acryl-based resin, an epoxy-based resin, and the like.

The first electrode 381 may be disposed on the insulating layer IL. The first electrode 381 may be electrically connected to the thin film transistor TFT through a contact hole formed by removing a portion of the insulating layer IL. The first electrode 381 may include a metal, an alloy, metal nitride, conductive metal oxide, a transparent conductive material, and the like, and form a via V. These may be used alone or in combination with each other. In some example embodiments, the first electrode 381 may have a multilayer structure including a plurality of metal layers. For example, the metal layers may have mutually different thickness or may include mutually different materials.

The pixel defining layer PDL may be disposed on the insulating layer IL. For example, the pixel defining layer PDL may expose a portion of a top surface of the first electrode 381 while covering both sides of the first electrode 381. The pixel defining layer PDL may be formed of an organic material or an inorganic material. In example embodiments, the pixel defining layer 310 may include an organic material.

The light emitting layer 383 may be disposed on the pixel defining layer PDL and the first electrode 381. The light emitting layer 383 may be formed by using at least one of light emitting materials for emitting different color lights (i.e., red light, green light, blue light, etc.) according to sub-pixels. Alternatively, the light emitting layer 383 may be formed by stacking a plurality of light emitting materials for generating different color lights such as red light, green light, and blue light to emit white light as a whole. In this case, a color filter may be disposed on the light emitting layer 383 which is disposed on the first electrode 381. The color filter may include at least one of a red color filter, a green color filter, and a blue color filter. In some example embodiments, the color filter may include a yellow color filter, a cyan color filter, and a magenta color filter. The color filter may include a photosensitive resin or a color photoresist.

The second electrode 383 may be disposed on the light emitting layer 382 and the pixel defining layer PDL. The second electrode 383 may include a metal, an alloy, metal nitride, conductive metal oxide, a transparent conductive material, and the like. These may be used alone or in combination with each other. In some example embodiments, the second electrode 383 may have a multilayer structure including a plurality of metal layers. For example, the metal layers may have mutually different thicknesses or may include mutually different materials.

The thin film encapsulation layer TFE may be disposed on the second electrode 383. The thin film encapsulation layer TFE may include at least one inorganic layer and at least one organic layer which are alternately stacked on each other. For example, the thin film encapsulation layer TFE may include a first inorganic layer, an organic layer disposed on the first inorganic layer, and a second inorganic layer disposed on the organic layer. The thin film encapsulation layer TFE may prevent the light emitting layer 382 from being degraded due to penetration of moisture, oxygen, and the like. In addition, the thin film encapsulation layer TFE may also function to protect the display panel DP from an external impact. Further, the thin film encapsulation layer TFE may improve flatness of the display panel DP.

In another example embodiment, a sealing substrate may be provided instead of the thin film encapsulation layer TFE to block external air and moisture from penetrating into the display apparatus.

Figure 16:
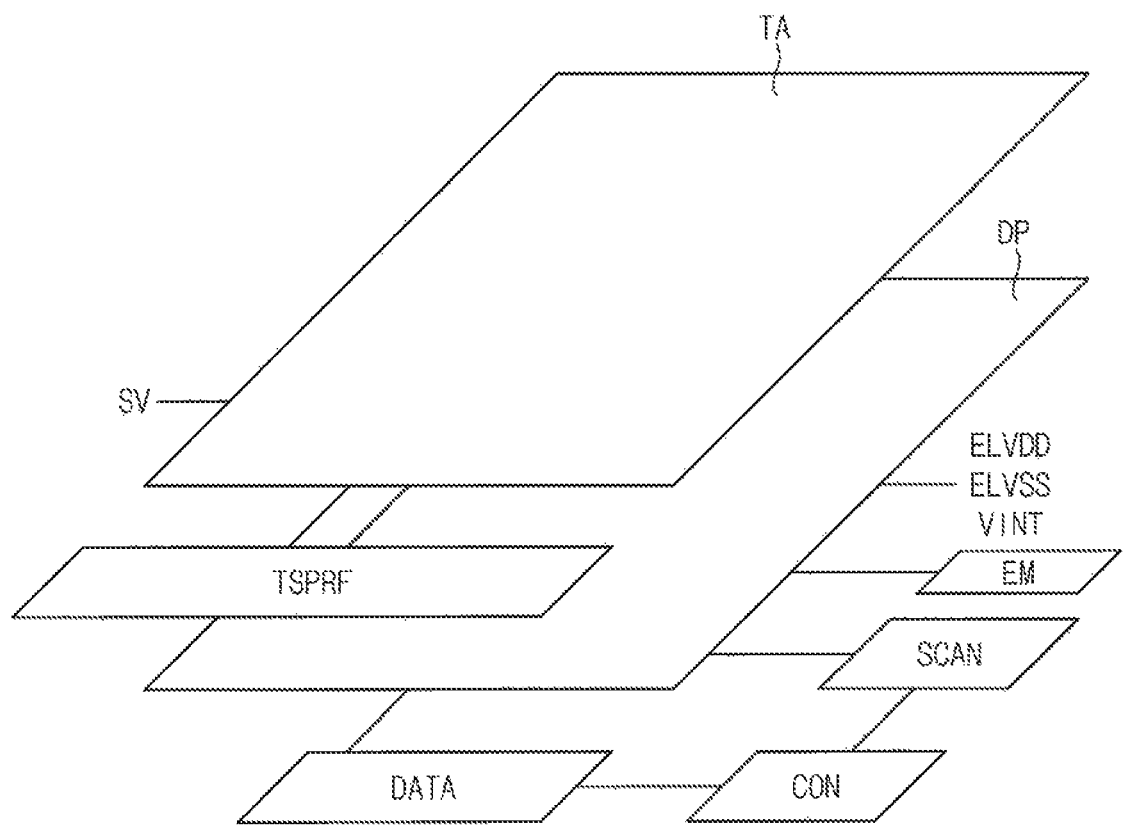
FIG. 16 is a block diagram schematically illustrating a display apparatus according to example embodiments.

FIG. 16 is a block diagram schematically illustrating a display apparatus according to example embodiments.

Referring to FIG. 16, the display apparatus is substantially the same as the display apparatus of FIG. 1 except that one touch antenna driver drives both the touch electrode and the antenna electrode instead of separately configuring the touch driver and the antenna driver to drive the touch antenna array. Therefore, redundant descriptions thereof will be omitted.

The display apparatus may include a display panel DP, a scan driver SCAN, a data driver DD, an emission control driver EM, a controller CON, a touch antenna array TA, and a touch antenna driver TSPRF.

The touch antenna driver TSPRF may transmit an electrical signal to the touch electrode (e.g. TE of FIG. 2) and may transmit an RF signal to the antenna electrode 210 (see FIG. 2), and may receive an electrical signal from the touch electrode and an RF signal from the antenna electrode 210.

The touch antenna driver TSPRF may be disposed in the non-display area making contact with one side of the display area (see AA of FIG. 3). The touch antenna driver TSPRF may be configured as an integrated circuit directly mounted on the touch antenna array TA, or may have a configuration in which a pad electrode is formed on the touch antenna array TA and the touch antenna array TA is connected to a separate driving substrate through the pad electrode.

Figure 17:
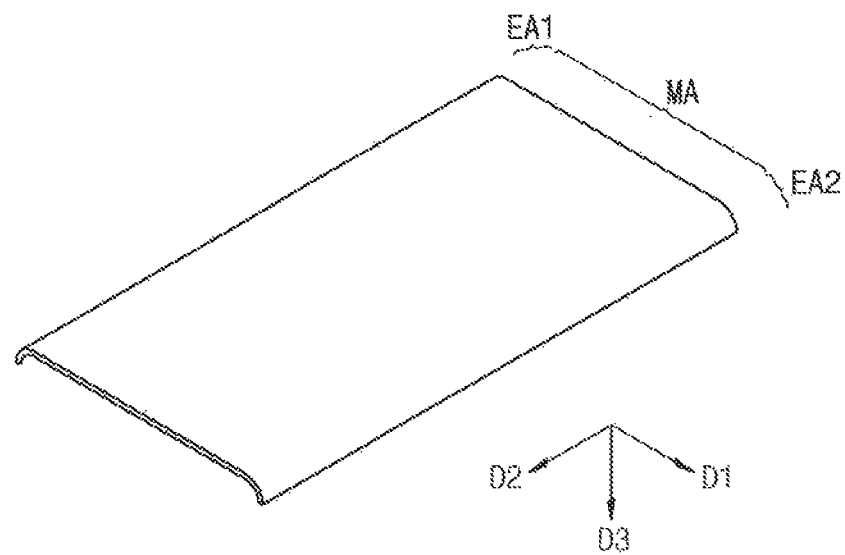
FIG. 17 is a perspective diagram illustrating a display apparatus according to example embodiments.
Figure 18:
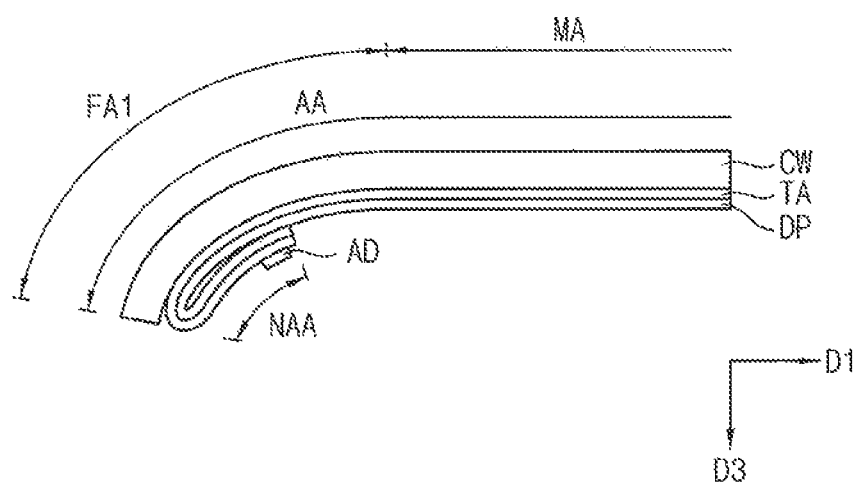
FIG. 18 is a cross-sectional diagram illustrating a first edge area of the display apparatus of FIG. 17.
Figure 19:
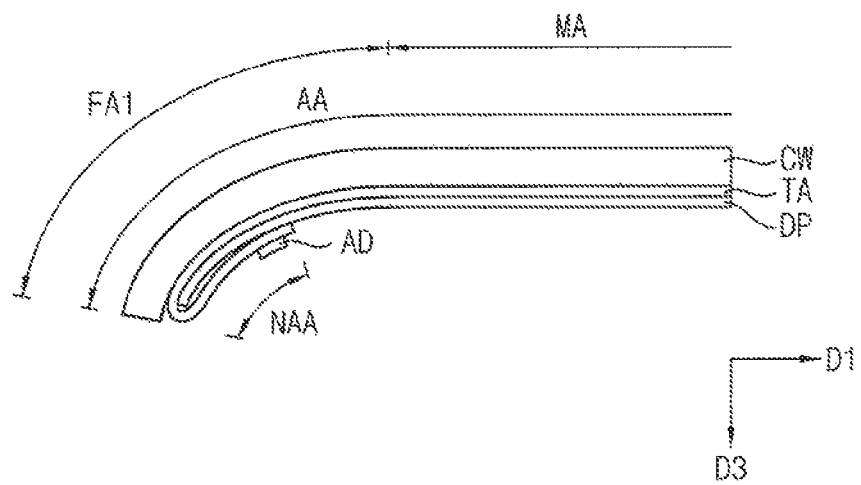
FIG. 19 is a cross-sectional diagram illustrating a first edge area of a display apparatus according to example embodiments.

FIG. 17 is a perspective diagram illustrating a display apparatus according to example embodiments, FIG. 18 is a cross-sectional diagram illustrating a first edge area of the display apparatus of FIG. 17, and FIG. 19 is a cross-sectional diagram illustrating a first edge area of a display apparatus according to example embodiments.

Referring to FIGS. 17 and 18, the display apparatus may include a display panel DP, a touch antenna array TA, and a cover window CW.

The display apparatus may include a display area AA in which an image is displayed and a non-display area NAA adjacent to the display area.

The display area AA may include a main display area MA, and a first edge display area EA1 and a second edge display area EA2 which are adjacent to the main display area MA. For example, the main display area MA may have a rectangular shape extending in the first direction D1 and the second direction D2 perpendicular to the first direction D1, and the first edge display area EA1 and the second edge display area EA2 may extend in the second direction D2 and may be connected to left and right sides of the main display area MA in the first direction D1, respectively. The first edge display area EA1 and the second edge display area EA2 may be bent in a third direction D3 perpendicular to the first direction D1 and the second direction D2 to form a curved surface.

The display panel DP may be a flexible display panel, for example, a flexible organic light emitting diode display panel.

The touch antenna array TA may be disposed on the display panel DP, and may include a touch electrode and an antenna electrode in the display area AA. The antenna electrode may be disposed in the first or second edge display area EA1 or EA2.

The touch antenna array TA may include a ground wiring, a touch wiring, a shielding electrode, and a feeder in the non-display area NAA.

The antenna driver AD may be disposed in the non-display area NAA. The antenna driver AD may be configured as an integrated circuit directly mounted on the touch antenna array TA, or may have a configuration in which a pad electrode is formed on the touch antenna array TA and the touch antenna array TA is connected to a separate driving substrate through the pad electrode.

The cover window CW may be attached onto the touch antenna array TA by using an adhesive layer (not shown). The cover window CW may have a curved edge portion to correspond to curved surfaces of the first and second edge display areas EA1 and EA2. In an electronic device (e.g., a smart phone) including the display apparatus, the cover window CW may constitute a portion of an outer surface of the electronic device.

In the first or second edge display area EA1 or EA2, a connection portion between the non-display area NAA and the display area AA may be folded so that the non-display area NAA is located on a rear side of the display area AA. In other words, edge portions of the display panel DP and the touch antenna array TA may be folded so as to be located on a rear side of a display surface. Accordingly, the antenna driver AD may be located on the rear side of the display surface of the display panel DP.

FIG. 19 is a cross-sectional diagram illustrating a first edge area of a display apparatus according to example embodiments.

Referring to FIG. 19, the display apparatus is substantially the same as the display apparatus of FIG. 18 except that the touch antenna array TA is longer than the display panel DP so that the edge portion of the touch antenna array TA is folded. Therefore, redundant descriptions thereof will be omitted.

The display apparatus may include a display panel DP, a touch antenna array TA, and a cover window CW.

An edge portion of the touch antenna array TA on which the antenna driver AD is disposed may be folded so as to be located on the rear side of the display surface. Accordingly, the antenna driver AD may be located on the rear side of the display surface of the display panel DP. In this case, the touch antenna array TA may include a base film (see FIG. 9, etc.) having a size larger than a size of the substrate (see 300 of FIG. 15) of the display panel DP.

Figure 20:
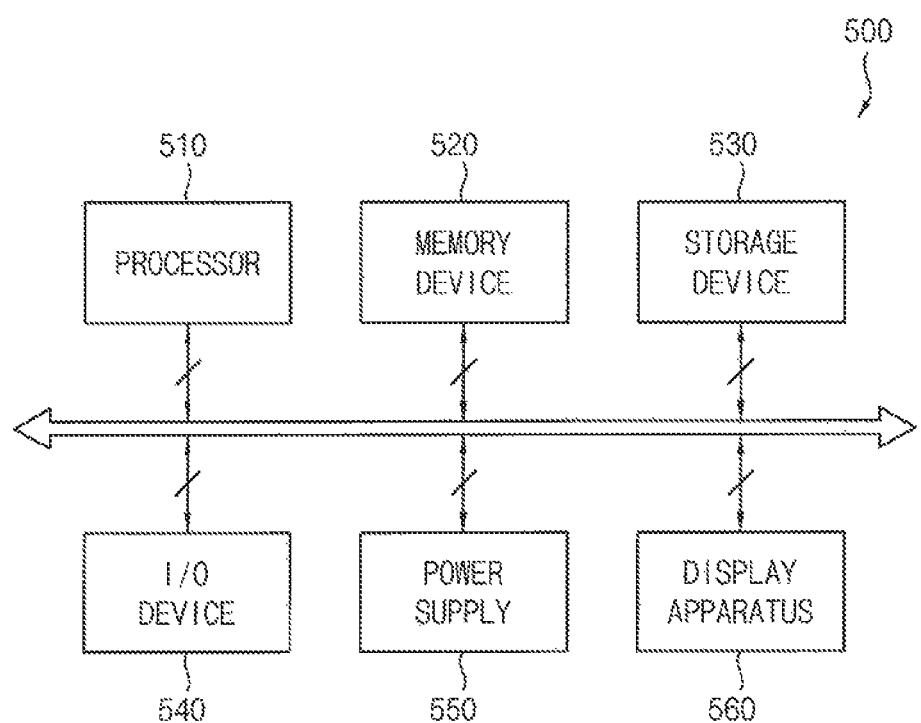
FIG. 20 is a block diagram illustrating an electronic apparatus according to example embodiments.

FIG. 20 is a block diagram illustrating an electronic apparatus according to example embodiments.

Referring FIG. 20, the electronic apparatus 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic apparatus 500 may further include a plurality of ports for communicating with a video card, a sound card, a memory card, a universal serial bus (USB) device, other electronic apparatuses, etc. In an example embodiment, the electronic apparatus 500 may be implemented as a smart phone. However, the electronic apparatus 500 is not limited thereto. For example, the electronic apparatus 500 may be implemented as a television, a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic apparatus 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc, and an output device such as a printer, a speaker, etc. The power supply 550 may provide power for operations of the electronic apparatus 500.

The display apparatus 560 may be coupled to other components via the buses or other communication links. In some example embodiments, the I/O device 540 may include the display apparatus 560. As described above, the display apparatus 560 includes a display panel configured to display an image and a touch antenna array disposed on the display panel. The touch antenna array includes a touch electrode and an antenna electrode to perform a touch function and an antenna function. Here, since a shielding electrode to which a ground voltage or a constant voltage is applied is disposed between a touch wiring electrically connected to the touch electrode and a feeder electrically connected to the antenna electrode, a signal distortion problem caused by a coupling capacitance between the touch wiring and the feeder, which are driven at different frequencies and voltages, can be prevented from occurring. Since these are described above, duplicated description related thereto will not be repeated.

The present inventive concept may be applied to a display apparatus and an electronic apparatus including the display apparatus. For example, the present inventive concept may be applied to a smart phone, a cellular phone, a video phone, a smart pad, a smart watch, a tablet PC, a car navigation system, a television, a computer monitor, a laptop, a head mounted display apparatus, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display apparatus including a display area in which an image is displayed and a non-display area adjacent to the display area, the display apparatus comprising:
 a display panel; and
 a touch antenna array disposed on the display panel,
 wherein the touch antenna array includes:
  a touch electrode layer disposed in the display area;
  a first conductive layer disposed in the non-display area and electrically connected to the touch electrode layer;
  an antenna electrode layer disposed in the display area;
  a second conductive layer disposed in the non-display area and electrically connected to the antenna electrode layer; and
  a shielding electrode layer disposed in both the display area and the non-display area and disposed between the first conductive layer and the second conductive layer in the non-display area, the shielding electrode layer being electrically isolated from the first and second conductive layers.

2. The display apparatus of claim 1, wherein the touch antenna array further includes:
 a third conductive layer disposed in the non-display area and spaced apart from the first conductive layer.

3. The display apparatus of claim 2, wherein a ground voltage or a fixed voltage is applied to the third conductive layer, and the shielding electrode layer is electrically connected to the third conductive layer.

4. The display apparatus of claim 2, wherein a ground voltage or a fixed voltage is applied to the third conductive layer, and the shielding electrode layer extends from the third conductive layer.

5. The display apparatus of claim 2, wherein the third conductive layer and the first conductive layer are disposed on a same layer.

6. The display apparatus of claim 2, wherein the third conductive layer and the first conductive layer are disposed on different layers.

7. The display apparatus of claim 1, wherein an antenna electrode of the antenna electrode layer is spaced apart from a touch electrode of the touch electrode layer when viewed in a plan view and does not overlap the touch electrode of the touch electrode layer.

8. The display apparatus of claim 1, wherein the touch electrode layer and the antenna electrode layer are disposed on a same layer.

9. The display apparatus of claim 1, wherein the touch antenna array further includes:
 a first insulating layer disposed between the first conductive layer and the shielding electrode layer; and
 a second insulating layer disposed between the shielding electrode layer and the second conductive layer.

10. The display apparatus of claim 1, wherein the second conductive layer and the antenna electrode layer contact each other through a contact hole formed in an insulating layer.

11. A display apparatus including a display area in which an image is displayed and a non-display area adjacent to the display area, the display apparatus comprising:
 a display panel; and
 a touch antenna array disposed on the display panel,
 wherein the touch antenna array includes:
  a touch electrode layer disposed in the display area;
  a first conductive layer disposed in the non-display area and electrically connected to the touch electrode layer;
  an antenna electrode layer disposed in the display area;
  a second conductive layer disposed in the non-display area and electrically connected to the antenna electrode layer; and
  a shielding electrode layer disposed in the non-display area and disposed between the first conductive layer and the second conductive layer, the shielding electrode layer being electrically isolated from the first and second conductive layers.

12. The display apparatus of claim 11, wherein the touch antenna array further includes:
 a third conductive layer disposed in the non-display area and spaced apart from the first conductive layer.

13. The display apparatus of claim 12, wherein a ground voltage or a fixed voltage is applied to the third conductive layer, and the shielding electrode layer is electrically connected to the third conductive layer.

14. The display apparatus of claim 12, wherein a ground voltage or a fixed voltage is applied to the third conductive layer, and the shielding electrode layer extends from the third conductive layer.

15. The display apparatus of claim 12, wherein the third conductive layer and the first conductive layer are disposed on a same layer.

16. The display apparatus of claim 12, wherein the third conductive layer and the first conductive layer are disposed on different layers.

17. The display apparatus of claim 11, wherein an antenna electrode of the antenna electrode layer is spaced apart from a touch electrode of the touch electrode layer when viewed in a plan view and does not overlap the touch electrode of the touch electrode layer.

18. The display apparatus of claim 11, wherein the touch electrode layer and the antenna electrode layer are disposed on a same layer.

19. The display apparatus of claim 11, wherein the touch antenna array further includes:
 a first insulating layer disposed between the first conductive layer and the shielding electrode layer; and
 a second insulating layer disposed between the shielding electrode layer and the second conductive layer.

20. The display apparatus of claim 11, wherein the second conductive layer and the antenna electrode layer contact each other through a contact hole formed in an insulating layer.

* * * * *